United States Patent
Cheng et al.

(10) Patent No.: US 12,351,454 B2
(45) Date of Patent: Jul. 8, 2025

(54) METHOD FOR PREPARING NANOCRYSTAL WITH CORE-SHELL STRUCTURE

(71) Applicant: TCL TECHNOLOGY GROUP CORPORATION, Huizhou (CN)

(72) Inventors: Luling Cheng, Huizhou (CN); Yixing Yang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 1318 days.

(21) Appl. No.: 17/037,609

(22) Filed: Sep. 29, 2020

(65) Prior Publication Data
US 2021/0024356 A1 Jan. 28, 2021

Related U.S. Application Data

(63) Continuation of application No. PCT/CN2019/110192, filed on Oct. 9, 2019.

(30) Foreign Application Priority Data

Oct. 9, 2018 (CN) .......................... 201811171921.9
Oct. 9, 2018 (CN) .......................... 201811171925.7

(Continued)

(51) Int. Cl.
C01B 19/04 (2006.01)
C09K 11/02 (2006.01)
(Continued)

(52) U.S. Cl.
CPC .............. *C01B 19/04* (2013.01); *C09K 11/02* (2013.01); *C09K 11/88* (2013.01); *H10H 20/01* (2025.01); *H10H 20/812* (2025.01)

(58) Field of Classification Search
CPC ......... C01B 19/04; C09K 11/02; C09K 11/88; H01L 33/005; H01L 33/06
See application file for complete search history.

(56) References Cited

U.S. PATENT DOCUMENTS

| | | | |
|---|---|---|---|
| 2005/0051769 A1 | 3/2005 | Jang et al. | |
| 2013/0295586 A1* | 11/2013 | Bartel | B82Y 30/00 435/7.1 |

(Continued)

FOREIGN PATENT DOCUMENTS

| | | |
|---|---|---|
| CN | 104498039 A | 4/2015 |
| CN | 105505393 A | 4/2016 |

(Continued)

OTHER PUBLICATIONS

World Intellectual Property Organization (WIPO) International Search Report for PCT/CN2019/110192 Jan. 8, 2020 6 Pages.

*Primary Examiner* — Monica D Harrison
*Assistant Examiner* — Andre C Stevenson
(74) *Attorney, Agent, or Firm* — ANOVA LAW GROUP, PLLC

(57) ABSTRACT

Method for preparing nanocrystals with a core-shell structure is provided. The method includes: providing quantum dot cores; and performing N growth processes of shell layers on a quantum dot core to form a nanocrystal with a core-shell structure. A shell source includes a shell source cation precursor and a shell source anion precursor, and the shell source cation precursor is a metal organic carboxylate. The N growth processes include one or more groups of M growth processes of adjacent shell layers, where N and M are positive integers, $N \geq 2$ and $N/3 \leq M \leq N-1$. Before and/or after performing each group of the M growth processes of adjacent shell layers, one of organic amine and organic carboxylic acid is mixed into a shell-layer-growth-reaction-system after a previous shell layer has formed, to form a mixed system to heat. A subsequent shell layer is grown over the previous shell layer.

19 Claims, 2 Drawing Sheets

(30) Foreign Application Priority Data

Oct. 9, 2018 (CN) .......................... 201811172936.7
Oct. 9, 2018 (CN) .......................... 201811172946.0
Oct. 9, 2018 (CN) .......................... 201811212274.1

(51) Int. Cl.
*C09K 11/88* (2006.01)
*H10H 20/01* (2025.01)
*H10H 20/812* (2025.01)

(56) References Cited

U.S. PATENT DOCUMENTS

2015/0166341 A1* 6/2015 Hamilton ............... C09K 11/70
    977/932
2019/0382565 A1* 12/2019 Jiang .................... C08K 5/1545
2019/0382656 A1* 12/2019 Mocatta ............... C09K 11/025

FOREIGN PATENT DOCUMENTS

| CN | 105658762 A | 6/2016 |
| CN | 106566526 A | 4/2017 |
| CN | 106893577 A | 6/2017 |

* cited by examiner

METHOD FOR PREPARING NANOCRYSTAL WITH CORE-SHELL STRUCTURE

CROSS-REFERENCES TO RELATED APPLICATION

This application is a continuation of International Application No. PCT/CN2019/110192, filed on Oct. 9, 2019, which claims priority to Chinese Patent Application No. 201811212274.1, Chinese Patent Application No. 201811172936.7, Chinese Patent Application No. 201811171921.9, Chinese Patent Application No. 201811172946.0, and Chinese Patent Application No. 201811171925.7, all filed on Oct. 9, 2018, the entire contents of all of which are incorporated herein by reference.

TECHNICAL FIELD

The present disclosure generally relates to the field of nanocrystal material preparing technology and, more particularly, relates to a method for preparing nanocrystals with a core-shell structure.

BACKGROUND

Nanocrystals (NCs), as emerging nanomaterials, may exhibit interesting phenomena, based on their electrical, optical, magnetic, and electrochemical properties, which cannot be achieved in corresponding bulk materials. Semiconductor nanocrystals, or quantum dots (QDs), have a size ranging from about 1 nm to about 10 nm. As particle size of quantum dots changes, a bandgap between a valence band and a conduction band may also change, which is known as quantum size effect. For example, absorption and emission of CdSe nanocrystals almost cover an entire visible spectral range. Therefore, semiconductor nanocrystals exhibit size-related photoluminescence properties. The semiconductor nanocrystals have been used in many technical fields including biomarker, diagnostics, chemical sensors, light-emitting diodes, electroluminescent devices, photovoltaic devices, lasers, and electronic transistors. However, application in different technical fields requires preparation of different types of semiconductor quantum dots. The preparation of high-quality semiconductor quantum dots is a prerequisite for effective application of the size effects of semiconductor quantum dots.

In past decades, scientists developed different methods for preparing high-quality semiconductor nanocrystals, by surface ligand modification and core-shell structure design. In a core-shell structure design, the core may include a narrow-bandgap semiconductor material and a shell layer may include a wide-bandgap material. Such core-shell structure may be formed by a one-step method, a two-step method, and a three-step method. In the one-step method, cores and shell layers of core-shell quantum dots are grown in a reaction vessel. In the two-step method, the formation of the core-shell quantum dots includes two steps where the cores are grown in a reaction vessel and then the cores of the quantum dots are taken out to another reaction vessel for growing shell layers. In the three-step method, the formation of the core-shell quantum dots includes three steps including: growing the cores in a reaction vessel; growing intermediate shell layers after taking out and placing the quantum dot cores in one other reaction vessel; and growing outermost shell layers after taking out and placing the core-shell quantum dots with the intermediate shell layers in a third reaction vessel. The growth methods of shell layers for forming the nanocrystals with the core-shell structure, including the one-step method, the two-step method, and the three-step method, simply use a shell source precursor for continuous injection growth, and cannot control quality of the growth of the shell layers effectively. On surfaces of particle seeds of the final quantum dot nanocrystals, crystal lattice strain between the atoms and the atoms in the shell layers is large, photothermal stability is undesirably not good, the size is not uniform, a number of lattice defects on surfaces of the epitaxially crystallized shell layers is large, and fluorescence intensity is low. Correspondingly, in the final core-shell quantum dots, photothermal stability is undesirably not good, fluorescence intensity is low, and solubility is poor. Therefore, it is important to provide growth methods of the shell layers in the core-shell quantum dots and to control the growth of the shell layers.

SUMMARY

One of the objects of the present disclosure is to provide methods for preparing nanocrystals with a core-shell structure, to at least partially alleviate problems including low photothermal stability, uneven size, and low fluorescence intensity of the nanocrystals with the core-shell structure, induced by large lattice strain between atoms at interfaces between the shell layers in the nanocrystals and lattice defects in the surfaces of the epitaxially crystallized shell layers.

To solve above technical problems, the present disclosure provides the following technical solutions.

One aspect of the present disclosure provides a method for preparing nanocrystals with a core-shell structure, including:

providing quantum dot cores;

performing N growth processes of a shell layer on surfaces of the quantum dot cores, to prepare N shell layers on each quantum dot core and achieve nanocrystals with the core-shell structure, where a shell source used for the shell layer growth may include a shell source cation precursor and a shell source anion precursor, the shell source cation precursor may be metal organic carboxylate, and the N growth processes include one or more groups of M growth processes of adjacent shell layers;

after and/or before each group of the M growth processes of the adjacent shell layers, mixing an organic amine with a shell layer growth reaction system where a previous layer has formed, to form a mixed system, and heating the mixed system; and growing a subsequent shell layer.

N may be an integer larger than or equal to 2.

M may be a positive integer and $N/3 \leq M \leq N-1$.

In the method for preparing the nanocrystal with the core-shell structure provided by the present disclosure, the metal organic carboxylate may be used as the cation precursor of the shell layers, and the growth step of the shell layer may be performed N-times to prepare the core-shell quantum dots with a multi-shell-layer core-shell structure. After and/or before each group of the M growth processes of the adjacent shell layers processes, the organic amine may be added to the shell layer growth reaction system where the previous layer has been formed, which is mixed and heated. Then the subsequent shell layer may be grown. The organic amine may bind on metal atomic surfaces of the previous shell layer easily. The organic amine may also exchange with a portion of metal organic carboxylate acid ligands on the previous shell layer derived from the shell source to fill cation vacancies in the previous shell layer. When growing the subsequent shell layer, a small energy may be needed for the organic amine to desorb from metal atoms on the surface of the previous shell layer, and the anions in the shell source precursor may combine with the metal ions on the surface of the previous shell layer easily to facilitate an epitaxial growth. Therefore, a large strain of crystal lattices on interfaces between shell layers of the quantum dots may be avoided, crystal lattice defects on surfaces of the epitaxially crystallized shell layers may be reduced. Correspondingly, the fluorescence intensity, photothermal stability and film-forming performance of the quantum dots may be improved, to improve current efficiency and device lifetime of a quantum-dot light-emitting diode (QLED) device.

BRIEF DESCRIPTION OF THE DRAWINGS

To more clearly illustrate the technical solutions of the present disclosure, the accompanying drawings to be used in the description of the disclosed embodiments are briefly described hereinafter. Obviously, the following drawings are merely examples for illustrative purposes of the present disclosure. For those of ordinary skill in the art, other drawings can be obtained based on these drawings without creative labor.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. For description purposes only, the embodiments below are used as examples to illustrate the present disclosure, and should not limit the scopes of the present disclosure.

In the description of the present application, it should be understood that the terms "first" and "second" are used for description purposes only, and cannot be understood as indicating or implying relative importance or implicitly indicating the number of technical features indicated. Thus, the features defined as "first" and "second" may explicitly or implicitly include one or more of the features. In the description of this application, the meaning of "plurality" is two or more, unless otherwise specifically limited.

Reference will now be made in detail to exemplary embodiments of the disclosure, which are illustrated in the accompanying drawings.

Figure 1:
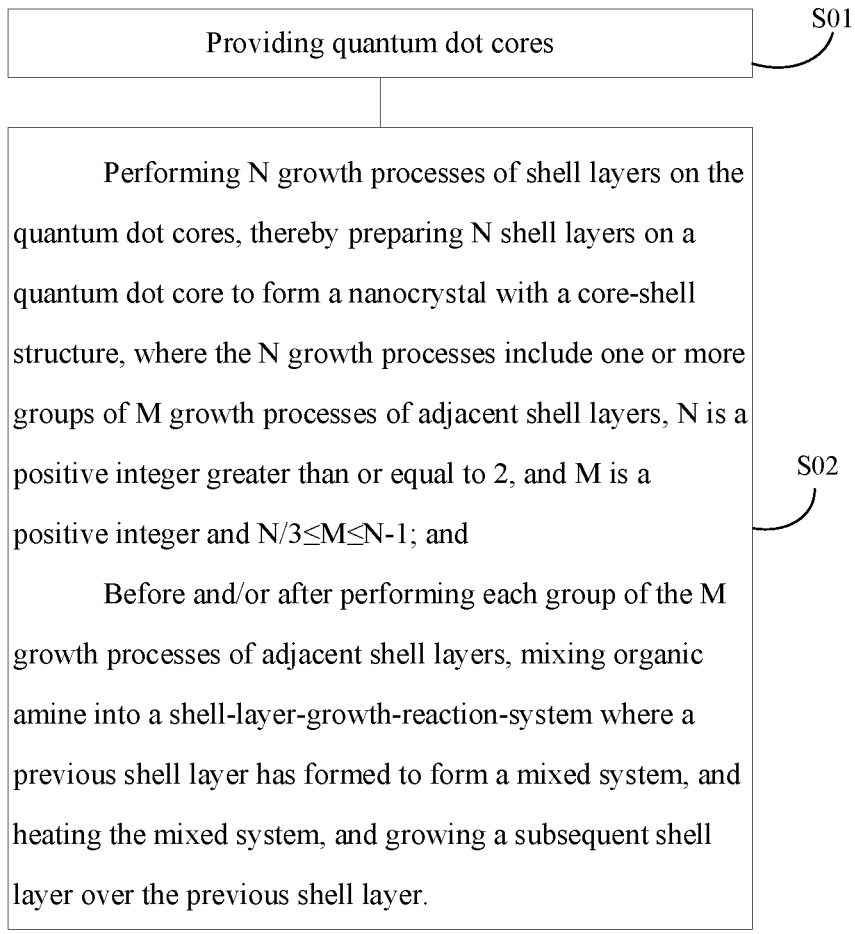
FIG. 1 illustrates an exemplary method for preparing nanocrystals with a core-shell structure consistent with various disclosed embodiments of the present disclosure.
Figure 2:
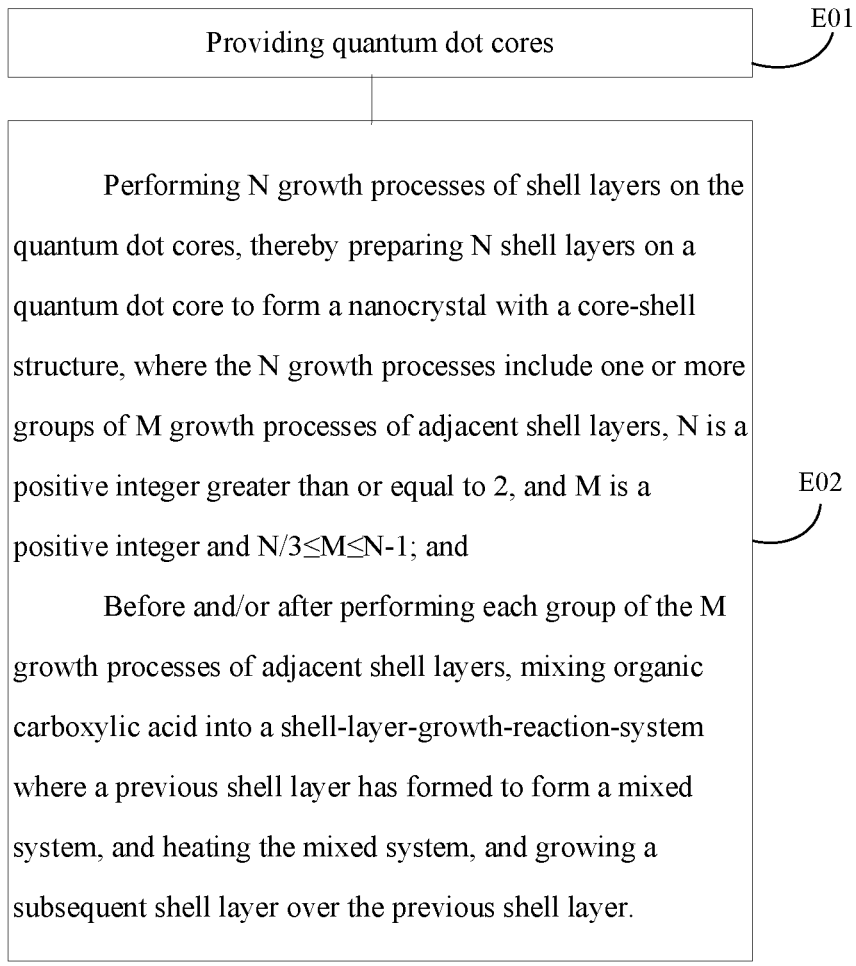
FIG. 2 illustrates another exemplary method for preparing nanocrystals with a core-shell structure consistent with various disclosed embodiments of the present disclosure.

The present disclosure provides a method for preparing nanocrystals with a core-shell structure. In one embodiment as illustrated in FIG. 1, the method may include:

S01: providing quantum dot cores; and

S02: performing N growth processes of shell layers on surfaces of the quantum dot cores, to prepare N shell layers on each quantum dot cores and achieve nanocrystals with the core-shell structure. A shell source used for the shell layer growth may include a shell source cation precursor and a shell source anion precursor. The shell source cation precursor may be metal organic carboxylate.

The N growth processes include one or more groups of M growth processes of adjacent shell layers. After and/or before each group of the M growth processes of the adjacent shell layers, an organic amine may be added to a shell layer growth reaction system where a previous layer has formed, which is mixed and heated. Then a subsequent shell layer may be grown.

N may be an integer larger than or equal to 2.

M may be a positive integer and $N/3 \leq M \leq N-1$.

In the method for preparing the nanocrystal with the core-shell structure provided by the present disclosure, the metal organic carboxylate may be used as the cation precursor of the shell layers, and the growth step of the shell layer may be performed N-times to prepare the core-shell quantum dots with a multi-shell-layer core-shell structure. The N growth processes include one or more groups of M growth processes of adjacent shell layers. After and/or before each group of the M growth processes of the adjacent shell layers, the organic amine may be added to the shell layer growth reaction system where the previous layer has been formed, which is mixed and heated. Then the subsequent shell layer may be grown. The organic amine may bind on metal atomic surfaces of the previous shell layer easily. The organic amine may also exchange with a portion of metal organic carboxylate acid ligands on the previous shell layer derived from the shell source to fill cation vacancies in the previous shell layer. When growing the subsequent shell layer, a small energy may be needed for the organic amine to desorb from metal atoms on the surface of the previous shell layer, and the anions in the shell source precursor may combine with the metal ions on the surface of the previous shell layer easily to facilitate an epitaxial growth. Therefore, a large strain of crystal lattices on interfaces between shell layers of the quantum dots may be avoided, crystal lattice defects on surfaces of the epitaxially crystallized shell layers may be reduced. Correspondingly, the fluorescence intensity, photothermal stability and film-forming performance of the quantum dots may be improved, to improve current efficiency and device lifetime of a quantum-dot light-emitting diode (QLED) device.

In some embodiments, the present disclosure has no limit on the shell growth method in S01, and S01 in the embodiments of the present disclosure may be applied to subsequent shell growth methods including, for example, a one-step method, a two-step method or a three-step method. In some embodiment, the quantum dot cores may be used as cores for a one-step shell growth process. In some other embodiments, the quantum dot cores in a solution may be the quantum dots after being cleaned and purified following the preparation of the quantum dots. This process may be applied in the two-step method or the three-step method.

In various embodiments, the quantum dot cores may be II/VI quantum dot cores, III/V quantum dot cores, III/VI quantum dot cores, II/III/VI quantum dot cores, or a combination thereof. These quantum dot cores are used as examples only to illustrate the present disclosure and should not limit the scopes of the present disclosure. The quantum dot cores may be any suitable quantum dots, and the present disclosure has no limit on this. For example, the II/VI quantum dot cores may be made of, but not limited to, CdS, CdSe, CdTe, ZnS, ZnSe, ZnTe, HgS, HgSe, HgTe, CdZnSe, ZnSSe, ZnCdS, ZnCdSe, ZnSeS, ZnCdTe, ZnCdSSe, ZnCdSeS, ZnCdTeS, or other suitable materials. For example, the II/VI quantum dot cores may be made of, but not limited to, InAs, InP, GaAs, GaP, GaSb, InSb, AlAs, AlP, AlSb, InGaAs, GaAsP, InAsP, or other suitable materials. For example, the III/VI quantum dot cores may be made of, but not limited to, InS, In$_2$S$_3$, InSe, In$_2$Se$_3$, In$_4$Se$_3$, InTe, In$_2$Te$_3$, GaS, Ga$_2$Se$_3$, GaSe, Ga$_2$Se$_3$, GaTe, Ga$_2$Te$_3$, or other suitable materials. For example, the II/III/VI quantum dot cores may be made of, but not limited to, CuInS, CuInZnS, CuInSeS, or other suitable materials. In some embodiments, the quantum dot cores may be the II/VI quantum dot cores.

In one embodiment, surface ligands may bind to the surfaces of the quantum dot cores. The surface ligands may be at least one of organic carboxylic acid ligands, organic phosphonic acid ligands, organic phosphine ligands, phosphonic oxide ligands, or a combination thereof. In some embodiments, the organic carboxylic acid ligands may be selected from, but not be limited to, at least one of oleic acid, myristic acid, and dodecanoic acid. The organic phosphonic acid ligands may be preferably selected from but not limited to at least one of octadecyl phosphonic acid, myristylphosphonic acid, dodecyl. The organic phosphine ligands may be preferably selected from but not limited to at least one of trioctylphosphine and tributylphosphine. The phosphine-based ligands may be preferably selected from but not limited to at least one of trioctylphosphine oxide, tributylphosphine oxide.

In one embodiment, before preparing shell layers on the surfaces of the quantum dot cores, the quantum dot cores may be modified.

In one embodiment, quantum dot cores may be heated up after being dispersed in a solution including the organic carboxylic acid, to perform a surface modification on the quantum dot cores. The organic carboxylic acid may bind with cations on the surfaces of the quantum dot cores to fill cation vacancies of the quantum dot cores and reduce defect states at the interfaces between shell layers. Correspondingly, good epitaxial interfaces may be provided for the subsequent growth of the shell layers. Further, the organic carboxylic acid may also passivate the surfaces of the quantum dot cores, to avoid self-maturing of the quantum dot cores in a stage of heating up to a temperature of the growth of the shell layers. Quantum dots with uniform particle size may be achieved.

In one embodiment, the quantum dot cores may be dispersed into the solution including the organic carboxylic acid, and then may be heated for about 20 minutes to about 60 minutes at a temperature of about 80 to about 150° C. In these conditions, the organic carboxylic acid may bind at the surfaces of the quantum dot cores stably, and may facilitate the passivating process of the organic carboxylic acid.

In one embodiment, the organic carboxylic acid in the solution containing the organic carboxylic acid may be the organic carboxylic acid having about 8 to about 18 carbon atoms. This organic carboxylic acid may have a relatively small steric hindrance, and may facilitate the passivating process of the organic carboxylic acid. Further, the organic carboxylic acid may be a linear organic carboxylic acid containing one carboxylic group. The linear organic carboxylic acid may be beneficial to reduce steric hindrance and promote the passivating process. In some embodiments, the organic carboxylic acid may be selected from at least one of, but not limited to, oleic acid, dodecanoic acid, myristic acid, hexadecanoic acid, and octadecanoic acid.

In one embodiment, the surface modification on the quantum dot cores using the organic carboxylic acid may include: dispersing the quantum dot cores into the solution including the organic carboxylic acid using a mass-molar amount ratio between the quantum dot cores and the organic carboxylic acid of about 10 mg:(3~10 mmol), to perform the surface modification on the quantum dots. To enable the organic carboxylic acid to fully passivate the quantum dot cores and reduce the defect states on the surfaces of the quantum dot cores, there may be a certain excess of the organic carboxylic acid. The excess of the organic carboxylic acid may not be too much. Otherwise, a viscosity may be too large and the subsequent growth rate of the shell layers may be affected and the formation of the shell layers may be impacted.

In another embodiment, the quantum dot cores may be heated up after being dispersed in the solution including the organic amine, to perform the surface modification on the quantum dot cores. The organic amine may bind with the cations on the surfaces of the quantum dot cores to fill up the cation vacancies of the quantum dot cores and reduce the defect states at the interfaces between shell layers. A binding force between the organic amine and the cations on the surfaces of the quantum dot cores may be weak, and a small energy may be needed for the organic amine to desorb from the metal atoms in a surface of a previous shell layer. Correspondingly, during the growth of the subsequent shell layer, the anions in the shell source precursor may be more easily combined with the metal atoms in the surfaces of the cores to achieve epitaxial growth. A large lattice strain of the atoms at the interfaces between the quantum dot cores and the shell layers may be avoided, and the lattice defects at the surfaces of the epitaxial crystallized shell layers may be reduced. Further, the amino function group in the organic amine may have a dipole effect, and may drive the shell layers to grow according to the crystal orientation of the quantum dot cores during epitaxial crystallization, so that the shell layers obtained by the shell layer growth may be consistent with the crystal form of the quantum dot cores, further reducing the lattice defects between the shell layers and the surface of the quantum dot cores.

In one embodiment, the quantum dot cores may be dispersed in the solution including the organic amine and then may be heated for about 20 minutes to about 60 minutes in a temperature of about 80 to about 150° C. In these conditions, the organic amine may bind at the surfaces of the quantum dots stably and may facilitate the passivating process of the organic amine.

In one embodiment, the organic amine in the solution including the organic amine may be the organic amine having about 8 to about 18 carbon atoms. This organic amine may have a relatively small steric hindrance, and may facilitate the passivating process of the organic amine. Further, the organic amine may be a linear organic amine containing one amino group. The linear organic amine may be beneficial to reduce steric hindrance and promote the passivating process. In some embodiments, the organic amine may be selected from at least one of, but not limited to, oleamine, trioctylamine, dodecylamine, tetradecylamine, hexadecylamine, octadecylamine.

In one embodiment, the surface modification on the quantum dot cores using the organic amine may include: dispersing the quantum dot cores into the solution including the organic amine using a mass-molar amount ratio between the quantum dot cores and the organic amine of about 10 mg:(3~10 mmol), to perform the surface modification on the quantum dots. To enable the organic amine to fully passivate the quantum dot cores and reduce the defect states on the surfaces of the quantum dot cores, there may be a certain excess of the organic amine. The excess of the organic amine may not be too much. Otherwise a viscosity may be too large and the subsequent growth rate of the shell layers may be affected and the formation of the shell layers may be impacted.

In the present disclosure, in S02, the shell layer growth reaction system may be a reaction material system and a process system for the shell layer growth on the surfaces of the quantum dot cores, for example, including the one-step method, the two-step method, or the three-step method (including the shell layer growth reaction material system and process system for the intermediate shell layers and the outermost shell layers). The shell layer growth process system may denote performing the N grow steps of the shell layer on the surfaces of the quantum dot cores, to prepare N shell layers. A relationship between the N growth processes of the shell layer and the N shell layers may be: adding the shell source into the solution including the quantum dot cores to perform a first shell layer growth and prepare a first shell layer; in some embodiments, based on the first shell layer, adding the shell source to perform a second shell layer growth to prepare a second shell layer on the surface of the first shell layer; and repeating this process, to forming an N-th shell layer after the N growth processes of the shell layer (that is, forming N shell layers on the surfaces of the quantum dot cores). The material system for the shell layer growth may denote the material system applied during the shell layer growth. In some embodiments with the quantum dot cores in the one-step shell layer growth, when performing the first shell layer growth, the shell source cation precursor and the anion precursor may be added to the product solution including the quantum dot cores to perform the first shell layer growth. During the second shell layer growth, the shell source cation precursor and the shell source anion precursor may be added to the solution system containing the material produced by the first shell layer growth to perform the second shell layer growth. By repeating this process, the N growth processes of the shell layer may be completed sequentially. Intervals between each group of the M growth processes of adjacent shell layers in different orders may denote process gaps between the completion of the growth of the previous shell layer and the growth of the subsequent shell layer. For example, to prepare the nanocrystals with the core-shell structure having three shell layers, M may take a value of 1 or 2 in various embodiments. Correspondingly, in one embodiment, the intervals between the M growth processes of adjacent shell layers in different orders may include the process gap between the completion of the growth of the first shell layer and the growth of the second shell layer. In another embodiment, the intervals between the M growth processes of adjacent shell layers in different orders may include the process gap between the completion of the growth of the second shell layer and the growth of the third shell layer. In another embodiment, the intervals between the M growth processes of adjacent shell layers in different orders may include the process gap between the completion of the growth of the first shell layer and the growth of the second shell layer and the process gap between the completion of the growth of the second shell layer and the growth of the third shell layer. In one embodiment, the solution including the quantum dot cores may be formed by: cleaning and purifying the prepared quantum dot cores; and then adding the quantum dot cores into a solvent. In the first shell layer growth, the quantum dot cores may be dispersed into the solution, and then the shell source cation precursor and anion precursor may be added into the solution containing the quantum dot cores to perform the first shell layer growth. In the second shell layer growth, the shell source cation precursor and anion precursor may be added into the solution system after completing the first shell layer growth to perform the second shell layer growth. By repeating this process, the N growth processes of the shell layer may be completed sequentially. The intervals between the M growth processes of adjacent shell layers in different orders may denote the process gaps between the completion of the growth of the previous shell layer and the growth of the latter shell layer. For example, to prepare the nanocrystals with the core-shell structure having three shell layers, M may take a value of 1 or 2 in various embodiments. Correspondingly, in one embodiment, the intervals between the M growth processes of adjacent shell layers in different orders may include the process gap between the completion of the growth of the first shell layer and the growth of the second shell layer. In another embodiment, the intervals between the M growth processes of adjacent shell layers in different orders may include the process gap between the completion of the growth of the second shell layer and the growth of the third shell layer. In another embodiment, the intervals between the M growth processes of adjacent shell layers in different orders may include the process gap between the completion of the growth of the first shell layer and the growth of the second shell layer and the process gap between the completion of the growth of the second shell layer and the growth of the third shell layer.

In one embodiment, in the solution containing the quantum dot cores, a ratio between the mass of the quantum dot cores and the volume of the solvent may be about 10 mg:(5~15 ml). In this concentration, distances between the quantum dot cores may be appropriate, to provide a good condition for the shell source precursor to crystallize on the surface of the quantum dot cores to form the shell layers. The shell layers with uniform thickness and a good dispersion may be achieved.

In one embodiment, the shell-source cation precursor may include at least one of organic metal carboxylates formed by reacting the organic carboxylic acid and metal oxides or metal salts including Cd, Zn, Pb, Ag, Hg, Fe, In, and Al. In some embodiments, the shell-source cation precursor may be selected from at least one of, but not limited to, zinc oleate, lead oleate, silver oleate, mercury oleate, indium oleate, copper oleate, iron oleate, manganese oleate, aluminum oleate, Zinc stearate, lead stearate, silver stearate, mercury stearate, indium stearate, copper stearate, iron stearate, manganese stearate, aluminum stearate, myristic acid zinc, lead tetradecanoate, silver tetradecanoate, mercury tetradecanoate, indium tetradecanoate, copper tetradecanoate, iron tetradecanoate, manganese tetradecanoate, aluminum tetradecanoate, Zinc hexadecanoate, lead hexadecanoate, silver hexadecanoate, mercury hexadecanoate, indium hexadecanoate, copper hexadecanoate, iron hexadecanoate, manganese hexadecanoate, hexadecanoate Aluminum alkanoate, zinc dodecanoate, lead dodecanoate, silver dodecanoate, mercury dodecanoate, indium dodecanoate, copper dodecanoate, iron dodecanoate, dodecanoic acid Manganese, aluminum dodecanoate, zinc octadecanoate, lead octadecanoate, silver octadecanoate, mercury octadecanoate, indium octadecanoate, copper octadecanoate, iron octadecanoate, manganese octadecenoate, or aluminum octadecenoate.

In one embodiment, the shell source anion precursor may be prepared from anion complexes formed by dispersing non-metallic elements including Te, Se, S, or P into organic molecules. When the shell-source anion precursor is an anion complex formed by organic molecules and non-metallic elements including Te, Se, S, or P, the organic molecules may be selected from, but not limited to, at least one of trioctylphosphine, tributylphosphine, oleic acid, and Octene, the organic molecule is selected from trioctylphosphine, tributylphosphine, oleic acid, or Octene.

In one embodiment, the anion precursor may be thiol, and the non-metal atom organic molecules may be organic molecules containing a single thiol (—HS) functional group (including, but not limited to, octadecanethiol, heptadecanethiol, hexadecanethiol, ten Pentamercaptan, tetradecanethiol, tridecanethiol, dodecanethiol, octathiol).

In one embodiment, the present dislcousre has no limit on the selction of the shell source. In some embodiments, the selection of the shell source may satisfy that a bandgap of the shell layers is larger than a bandgap of the quantum dot cores.

In one embodiment, the shell source cation precursor may include at least one of organometallic carboxylates including Cd, Zn, or Pb, and the shell-source anion precursor may be anions complex or thiol formed by dispersing Te, Se, or S as elements into organic acids.

In one embodiment, for each shell layer growth, the shell source cation precursor and the shell source anion precursor may be dispersed into a solvent to get a precursor solution. Then the precursor solution may be added into the shell layer growth reaction system to perform the shell layer growth. In some embodiments, for each shell layer growth, after dispersing the shell source cation precursor and the shell source anion precursor into the solvent to get the precursor solution, the precursor solution may be added into the shell layer growth reaction system at a temperature of about 150° C. to about 320° C., to perform the shell layer growth. In each shell layer growth, the solvent may be selected from, but not limited to, TOP, TBP, OA, ODE, or OAM. When adding the shell source to perform the shell layer growth, there maybe be no limit on order for adding the shell source cation precursor and the shell source anion precursor. For example, in one embodiment, the shell source may be a mixture solution containing the dispersed the shell source cation precursor and the shell source anion precursor. Correspondingly, a process for adding the shell source may include: adding the shell source cation precursor and the shell source anion precursor into the solvent respectively to get the precursor solution containing the shell source cation precursor and the shell source anion precursor. The shell source cation precursor solution may be added before the shell source anion precursor solution. In some other embodiments, when adding the shell source cation precursor and the shell source anion precursor into the solvent respectively to get the precursor solution containing the shell source cation precursor and the shell source anion precursor, in the N growth processes of shell layer growth, the shell source cation precursor may be added into the shell layer growth reaction system after the shell source anion precursor to perform a current shell layer growth. The anions added firstly may bind with the metal atoms in the surface of the quantum dot cores more conveniently for epitaxial growth. A large lattice strain of the atoms at the interface between the quantum dot cores and the shell layers may be avoided, and the lattice defects at the surfaces of the epitaxial crystallized shell layers may be reduced. In the precursor solution, a concentration of the shell source cations may be about 1.5 mmol/ml to about 1.5 mmol/ml, and a concentration of the shell source anions may be about 1.5 mmol/ml to about 1.5 mmol/ml. The shell source cation precursor and the shell source anion precursor may keep an appropriate concentration and a dispersing density, to facilitate the binding of the cations and anions at the surfaces of the quantum dot cores. Uniform and stable shell layers may be achieved. In some embodiments, a total thickness of the shell layers (a sum of a thickness of each of the N shell layers) may be about 5 nm to about 12 nm. In some embodiments, in the N shell layers, the thickness of each shell layer may be about 0.1 nm to about 2 nm, and N may have a value of about 6 to about 18. If the thickness of each shell layer is too large or the number of times of the shell layer growth is too small, each shell layer may be too thick, the organic amine and/or the organic phosphine may not be fully bonded to the defects in the shell layers, and the lattice defects may not be reduced effectively. In some embodiments, when preparing each shell layer, a molar amount-mass ratio between the shell source cation precursor and the quantum dot cores may be about (1~1.5 mmol):10 mg, and a molar amount-mass ratio between the shell source anion precursor and the quantum dot cores may be about (1~1.5 mmol):10 mg. The shell source precursor with this ratio may be added to achieve a shell layer with a suitable thickness when performing a corresponding single cycle of shell layer growth.

In the present disclosure, the N growth processes include one or more groups of M growth processes of adjacent shell layers. After and/or before each group of the M growth processes of the adjacent shell layers processes, the organic amine may be added to the shell layer growth reaction system where the previous layer has been formed, which is mixed and heated. Then a subsequent shell layer may be grown. The organic amine may bind on a metal atomic surface of the previous shell layer easily. The organic amine may also exchange with a portion of metal organic carboxylate acid ligands on the previous shell layer derived from the shell source and fill cation vacancies in the previous shell layer. When growing the subsequent shell layer, a small energy may be needed for the organic amine to desorb from metal atoms on the surface of the previous shell layer, and the anions in the shell source precursor may bind with the metal ions on the surface of the previous shell layer easily to facilitate an epitaxial growth. Therefore, a larger strain of crystal lattices on interfaces between the shell layers of the quantum dots with the core-shell structure may be avoided, crystal lattice defects on surfaces of the epitaxially crystallized shell layers may be reduced. Correspondingly, the fluorescence intensity, photothermal stability and film-forming property of the quantum dot may be improved, to improve current efficiency and device lifetime of a quantum-dot light-emitting diode (QLED) device.

In one embodiment, if the number of organic amine modifications is too small, the concentration of organic amines in the shell growth reaction system may decrease as the growth of different layers of shells progresses, and the organic amines may not bind to the surface of a previous shell layer among growth processes of adjacent shell layers. Therefore, before and/or after performing each group of the M growth processes of adjacent shell layers processes, in embodiments where the organic amine alone is used to modify the previous shell layer, where the organic amine and the organic phosphine are used as modifiers to modify the obtained previous shell layer, or where the organic amine is used to modify the previous shell layer and the organic amine and organic phosphine are used to modify the obtained previous shell layer, the total number of modifications M may be required to have an appropriate value. M may have a value of $N/3 \leq M \leq N-1$. In some embodiments, to achieve enough effect of organic amine modification, between each of the N−1 growth processes for adjacent shell layers, organic amine may be added to the shell growth reaction system that has formed in the previous shell layer growth which is mixed and heated, then the growth of the subsequent shell layer, that is, M=N−1.

In one embodiment, during a process for adding the organic amine to the shell growth reaction system that has formed in the previous shell layer growth which is mixed and heated and then the growth of the subsequent shell layer, according to a ratio between the molar amount of the organic amine and the mass of the quantum dot cores of about (0.2~0.9 mmol):10 mg, the organic amine may be added into the shell growth reaction system that has formed in the previous shell layer growth which is mixed and heated subsequently.

In one embodiment, the organic amine may be an organic amine having about 8 to about 18 carbon atoms. This organic amine may have a relatively small steric hindrance, and may facilitate the passivating process of the organic amine. In some embodiments, the organic amine may be selected from, but not limited to, at least one of oleylamine, trioctylamine, dodecylamine, tetradecylamine, hexadecylamine, octadecylamine.

In one embodiment, the organic amine may be a linear organic amine containing one amino group. The linear organic amine may be beneficial to reduce steric hindrance and may bind to the surface of the quantum dots easily. Also, using the linear organic amine containing one amino group may have an ideal exchange effect to improve the stability of the cyclic modification and exchange reactions because of the single binding sites.

In one embodiment, between the growth processes for adjacent shell layers in different orders, the organic phosphine may be added to the shell layer growth reaction system, or both the organic amine and organic phosphine may be added to the shell layer growth reaction system, which is mixed and heated. Then a subsequent shell layer may be grown. By adding the organic phosphine between growth processes for adjacent shell layers, the organic phosphine may produce coordination effect with non-metal atoms on the surfaces of the shell layers of quantum dot nanocrystals, to further increase the diversity of nanocrystalline surface modifiers, reduce surface defects, and thus increase fluorescence intensity of the final sample.

In one embodiment where the organic phosphine is added, when M<N−1, before and/or after performing each group of the M growth processes of adjacent shell layers, the organic amine may be added to the shell layer growth reaction system where the previous layer has been formed, which is mixed and heated. Then a subsequent shell layer may be grown. Further, between S growth processes for adjacent shell layers in a different order, the organic phosphine may be separately added to the shell layer growth reaction system where the previous layer has been formed, which is mixed and heated. Then a subsequent shell layer may be grown. Between the S growth processes for adjacent shell layers may mean between the growth processes for adjacent shell layers that organic amine, or both organic amine and organic phosphine, are not added to the shell growth reaction system after the previous shell layer has formed to modify the previous shell layer relative to the current order shell layer. S may be a positive integer, and 1≤S≤(N−1)−M. Between the S growth processes of adjacent shell layers in different orders, adding the organic phosphine to the shell growth reaction system after the previous shell layer has formed to mix and heat, and then performing the growth of subsequent shell layer, may include: adding the organic phosphine with a ratio between the molar amount of the organic phosphine and the mass of the quantum dot cores of about (0.2~0.9 mmol): 10 mg, to the shell layer growth reaction system after the previous shell layer has formed, to mix and heat.

In another embodiment where the organic phosphine is added, each group of the M growth processes of adjacent shell layers includes one or more sub-groups of L growth processes of adjacent shell layers. Before or after performing each sub-group of the L growth processes of adjacent shell layers, the organic phosphine and the organic amine may be added to the shell layer growth reaction system where the previous layer has formed, to mix and heat. Then a subsequent shell layer may be grown. L may be a positive integer and L≤M. In some embodiments, to improve the modification effect of the organic amine, in each of the (N−1) growth processes for adjacent shell layers, the organic amine may be added to the shell layer growth reaction system where the previous layer has formed, to mix and heat. Then a subsequent shell layer may be grown. That is L=M=N−1. Between the L growth processes of adjacent shell layers in different orders, adding the organic phosphine and the organic amine to the shell growth reaction system that has formed the previous shell to mix and heat, and then performing the growth of subsequent shell layer, may include: adding the organic phosphine and organic amine with a ratio between the molar amount sum of the organic phosphine and the organic amine and the mass of the quantum dot cores of about (0.2~0.9 mmol): 10 mg, to the shell layer growth reaction system that has formed the previous shell layer, to mix and heat.

In one embodiment, the organic phosphine may be an organic phosphine which is liquid at room temperature. In some embodiments, the organic phosphine may be selected from, but not limited to, at least one of trioctylphosphine and tributylphosphine. In some embodiments, the coordination effect between the organic phosphine and the non-metal atoms on the surfaces of the shell layers of the quantum dot nanocrystalline may be more significant.

The organic amine and/or organic phosphine may form a complex with the shell source cation precursor to affect the crystallization effect of the shell layers. The non-metallic atoms pyrolyzed by the shell source anion precursor may undergo side reactions with the modifier and will affect the growth of the shell layers. Therefore, in some embodiments, the organic amine and/or organic phosphine cannot be added at the same time as the shell-source anion precursor or the shell-source cation precursor.

In one embodiment, to ensure the shell layer source added every time can epitaxially crystallize adequately, a time of each shell layer growth may be about 5 minutes to about 20 minutes, or after the precursor solution is injected into the shell layer growth reaction system and reacted for about 5 minutes to about 20 minutes, the organic amine and the organic phosphine may be added to modify the previous shell layer. That is, after adding the shell source for the growth of the shell layer preceding the current shell layer into the shell layer growth system for about 5 minutes to about 20 minutes, before and/or after performing each group of the M growth processes of adjacent shell layers, the organic amine may be added to the shell growth reaction system that has formed the previous shell layer to mix and heat, and the growth of subsequent shell layer may be performed.

In another embodiment, after adding the shell source for the growth of the shell layer preceding the current shell layer into the shell layer growth system for about 5 minutes to about 20 minutes, between each of the L growth processes for adjacent shell layers in different orders, the organic amine, and the organic phosphine may be added to the shell growth reaction system that has formed the previous shell layer to mix and heat, and the growth of the subsequent shell layer may be performed.

In another embodiment, after adding the shell source for the growth of the shell layer preceding the current shell layer into the shell layer growth system for about 5 minutes to about 20 minutes, between each of the S growth processes for adjacent shell layers in different orders, the organic phosphine may be added to the shell growth reaction system that has formed the previous shell layer to mix and heat, and the growth of the subsequent shell layer may be performed.

In some embodiment, to ensure that the organic amine and/or the organic phosphine modify the surface of the previous shell layer adequately, after adding the organic amine and/or the organic phosphine into the shell layer growth reaction system for about 5 minutes to about 20 minutes, the precursor solution for growing the subsequent shell layer may be added to the shell layer growth reaction system to grow the subsequent shell layer. The present disclosure has no limit on the process to add the organic amine and/or the organic phosphine into the shell layer growth reaction system after the previous shell layer has formed. The organic amine and/or the organic phosphine may be added together or separately.

In one embodiment, before and/or after performing each group of the M growth processes of adjacent shell layers, after adding the organic amine into the shell layer growth reaction system after the previous shell layer has formed to mix and heat for about 5 minutes to about 20 minutes at a temperature of about 150° C. to about 320° C., the shell source for growing the subsequent shell layer may be added to the shell layer growth reaction system to grow the subsequent shell layer.

In another embodiment, between the L growth processes for adjacent shell layers in different orders, after adding the organic phosphine and the organic amine into the shell layer growth reaction system after the previous shell layer has formed to mix and heat for about 5 minutes to about 20 minutes at a temperature of about 150° C. to about 320° C., the shell source for growing the subsequent shell layer may be added to the shell layer growth reaction system to grow the subsequent shell layer.

In another embodiment, between the S growth processes for adjacent shell layers in different orders, after adding the organic phosphine into the shell layer growth reaction system after the previous shell layer has formed to mix and heat for about 5 minutes to about 20 minutes at a temperature of about 150° C. to about 320° C., the shell source for growing the subsequent shell layer may be added to the shell layer growth reaction system to grow the subsequent shell layer.

In one embodiment, the organic phosphine and/or organic amine with a ratio between the molar amount of the organic phosphine and/or the organic amine and the mass of the quantum dot cores of about (0.2~0.9 mmol): 10 mg, may be added to the shell layer growth reaction system that has formed the previous shell layer to mix and heat, modifying the previous shell layer. Then the subsequent shell layer may be grown. When the content of the organic amine and/or the organic phosphine is too low, the modification effect may not be applied enough. When the content of the organic amine and/or the organic phosphine is too high, the excess organic amine and/or the excess organic phosphine may inhibit the pyrolysis of the shell source cation precursor. The organic amine and/or the organic phosphine may form complexes with the shell source cation precursor. After the pyrolysis of the shell source anion precursor to form atoms, the atoms may combine with the organic amine and/or the organic phosphine, which is not beneficial to the growth of the shell layers.

In one embodiment, the nanocrystals with the core-shell structure may be modified by using a post-treatment reagent.

The present disclosure provides three methods to modify the nanocrystals with the core-shell structure.

In one method for modifying the nanocrystals with the core-shell structure, the organic phosphine may be used to modify the nanocrystals with the core-shell structure. The nanocrystals with the core-shell structure may be dispersed into a solution containing the organic phosphine, to modify the nanocrystals with the core-shell structure. The organic phosphine may be combined coordinately with the non-metal atoms on the surface of the shell layers of the nanocrystals, to fill the anion vacancies of the nanocrystals with the core-shell structure and reduce the defect states on the surface of the nanocrystals with the core-shell structure. The fluorescence intensity of the nanocrystals with the core-shell structure may be improved further.

In the method using the organic phosphine to modify the nanocrystals with the core-shell structure, an appropriate amount of the organic phosphine may be needed in an appropriate temperature range to achieve a good effect. In some embodiments, the process of dispersing the nanocrystals with the core-shell structure into the solution containing the organic phosphine to modify the nanocrystals with the core-shell structure may include: according to a molar amount-mass ratio between the phosphine and the nanocrystals with the core-shell structure of about (2~5 mmol):10 mg, dispersing the nanocrystals with the core-shell structure into the solution containing the organic phosphine. When the content of the organic phosphine is too low, the organic phosphine may not passivate the anion vacancies enough, and the fluorescence intensity of the nanocrystals with the core-shell structure may not be improved enough. When the content of the organic phosphine is too high, film formation performance of the nanocrystals with the core-shell structure may be affected when preparing a film layer. In some embodiments, the process of dispersing the nanocrystals with the core-shell structure into the solution containing the organic phosphine to modify the nanocrystals with the core-shell structure may include: dispersing the nanocrystals with the core-shell structure into the solution containing the organic phosphine; and then heating to about 100° C. to 320° C. for about 10 minutes to about 60 minutes. When the temperature for the organic phosphine to modify the nanocrystals with the core-shell structure is too low and/or the time for the organic phosphine to modify the nanocrystals with the core-shell structure is too short, the organic phosphine may not passivate the anion vacancies enough or even may not passivate the anion vacancies, and the fluorescence intensity of the nanocrystals with the core-shell structure may not be improved. When the temperature for the organic phosphine to modify the nanocrystals with the core-shell structure is too high and/or the time for the organic phosphine to modify the nanocrystals with the core-shell structure is too long, the organic phosphine may evaporate easily to affect the modifying result and the high temperature may affect the stability of the structure of the nanocrystals with the core-shell structure.

In one embodiment, the organic phosphine may include at least one of trioctylphosphine or tributylphosphine.

In one embodiment, the quantum dot cores may be dispersed into the solution containing the organic carboxylic acid and be heated to perform surface modification on the quantum dot cores. Subsequently, a plurality of shell layer growth may be performed on the surface of the quantum dot cores. Further, the solution containing the organic amine may be added to the shell layer growth reaction system after the previous shell layer has formed, and be mixed and heated. Then the subsequent shell layer may be grown to prepare the nanocrystals with the core-shell structure. Finally, the nanocrystals with the core-shell structure may be dispersed into the solution containing the organic phosphine to modify the nanocrystals with the core-shell structure. The fluorescence intensity of the nanocrystals with the core-shell structure may be improved. Using organic amine to modify the quantum dot cored may effectively avoid the formation of lattice defects between the quantum dot cores and the first shell layer. Between growth processes for adjacent shell layers, adding the organic amine to the shell layer growth reaction system after the previous shell layer has formed to mix and heat may fill the cationic defects on the surface of the quantum dots with the core-shell structure, while may not affect the surface anion defects. Based on this, the prepared nanocrystals with the core-shell structure may be modified using the organic phosphine, and the organic phosphorus may be coordinately combined with the non-metal atoms on the surface of the shell layers of the nanocrystals with the core-shell structure, to fill the anions vacancies on the surface of the shell layers of the nanocrystals with the core-shell structure and reduce the defect states on the surface of the nanocrystals with the core-shell structure. The fluorescence intensity of the nanocrystals with the core-shell structure may be improved further.

In another method for modifying the nanocrystals with the core-shell structure, the organic acid may be used to modify the nanocrystals with the core-shell structure. The nanocrystals with the core-shell structure may be dispersed into a solution containing the organic acid, to modify the nanocrystals with the core-shell structure. The organic acids may effectively eliminate the protonated organic amine attached to the surface of the shell layers of the nanocrystals with the core-shell structure (derived from the modifier organic amine used to eliminate lattice defects during the growth of the shell layers), and reduce charged organic amine ligands on the surface of the nanocrystals with the core-shell structure. Excitons (electrons) generated by the nanocrystals with the core-shell structure when emitting light may be prevented from being captured by the charged organic amine ligands on the surface, to further enhance the transient fluorescence lifetime of the nanocrystals.

In the method using the organic acid to modify the nanocrystals with the core-shell structure, an appropriate amount of the organic acid may be needed in an appropriate temperature range to achieve a good effect. In some embodiments, the process of dispersing the nanocrystals with the core-shell structure into the solution containing the organic acid to modify the nanocrystals with the core-shell structure may include: according to a molar amount-mass ratio between the acid and the nanocrystals with the core-shell structure of about (5~10 mmol):10 mg, dispersing the nanocrystals with the core-shell structure into the solution containing the organic acid. When the content of the organic acid is too low, the protonated organic amine attached to the surface of the shell layers of the nanocrystals with the core-shell structure may not be eliminated effectively, and the transient fluorescence lifetime of the nanocrystals may not be improved effectively. When the content of the organic acid is too high, the film formation performance of the nanocrystals with the core-shell structure when forming film may be affected. In some embodiments, the process of dispersing the nanocrystals with the core-shell structure into the solution containing the organic acid to modify the nanocrystals with the core-shell structure may include: dispersing the nanocrystals with the core-shell structure into the solution containing the organic acid; and then heating to about 240° C. to 320° C. for about 30 minutes to about 90 minutes. When the temperature for the organic acid to modify the nanocrystals with the core-shell structure is too low and/or the time for the organic acid to modify the nanocrystals with the core-shell structure is too short, the protonated organic amine attached to the surface of the shell layers of the nanocrystals with the core-shell structure may not be eliminated effectively, and the transient fluorescence lifetime of the nanocrystals may not be improved effectively. When the temperature for the organic acid to modify the nanocrystals with the core-shell structure is too high and/or the time for the organic acid to modify the nanocrystals with the core-shell structure is too long, the organic acid may evaporate easily to affect the modifying result and the high temperature may affect the stability of the structure of the nanocrystals with the core-shell structure.

In one embodiment, the organic acid may be an organic acid having about 8 to about 18 carbon atoms. The organic acid having about 8 to about 18 carbon atoms may have small steric hindrance and high reactivity. Further, in some embodiments, the organic acid for modifying the nanocrystals with the core-shell structure may have a linear carboxylic acid containing terminal carboxyl groups, to ensure better reactivity and better elimination of the protonated organic amine. In some embodiments, the organic acid reagent may include at least one of oleic acid, dodecanoic acid, myristic acid, hexadecanoic acid, or octadecanoic acid.

In another method for modifying the nanocrystals with the core-shell structure, the organic acid and the organic phosphine may be used to modify the nanocrystals with the core-shell structure. The nanocrystals with the core-shell structure may be dispersed into a solution containing the organic acid and the organic phosphine, to modify the nanocrystals with the core-shell structure. The organic phosphine may be combined coordinately with the non-metal atoms on the surface of the shell layers of the nanocrystals, to passivate the anion vacancies of the nanocrystals with the core-shell structure and reduce the defect states on the surface of the nanocrystals with the core-shell structure. The fluorescence intensity of the nanocrystals with the core-shell structure may be improved further. The organic acids may effectively eliminate the protonated organic amine attached to the surface of the shell layers of the nanocrystals with the core-shell structure (derived from the modifier organic amine used to eliminate lattice defects during the growth of the shell layers), and reduce charged organic amine ligands on the surface of the nanocrystals with the core-shell structure. Excitons (electrons) generated by the nanocrystals with the core-shell structure when emitting light may be prevented from being captured by the charged organic amine ligands on the surface, to further enhance the transient fluorescence lifetime of the nanocrystals. In the process of dispersing the nanocrystals with the core-shell structure into a solution containing the organic acid and the organic phosphine to modify the nanocrystals with the core-shell structure, the organic acid and the organic phosphine may form interlaced ligands on the surface of the nanocrystals with the core-shell structure combined with the metal and nonmetal atoms on the surface of the nanocrystals. The interlaced ligands may further enhance the solubility and stability of the nanocrystals. Further, when the nanocrystals with the core-shell structure are dispersed in the solution containing the organic acid and the organic phosphine to modify the nanocrystals with the core-shell structure, the organic acid may promote an unstably crystallized portion of the surface of the quantum dots with the core-shell structure to decompose. The metal atoms after decomposition and organic acids may form the metal cation precursor, and the anions obtained after decomposition and the organic phosphine may form the anion precursor. The metal cation precursor and the anion precursor may preferentially undergo shell layer growth on the surface of small-particle nanocrystals with the core-shell structure having a relatively large bulk surface and a fast growth rate, to improve the size uniformity of the quantum dots with the core-shell structure.

A process of dispersing the nanocrystals with the core-shell structure in the solution containing the organic acid and the organic phosphine can be flexibly selected. For example, in one embodiment, the organic acid and organic phosphine with a certain ratio may be dissolved in a solvent and heated to form a mixed solution, then the nanocrystals with the core-shell structure may be dispersed in the mixed solution. In another embodiment, after dispersing the nanocrystals with the core-shell structure in the solution containing organic phosphine, a certain proportion of organic phosphine may be added to the reaction system. In another embodiment, after dispersing the nanocrystals with the core-shell structure in the solution containing organic phosphine, a certain proportion of organic acid may be added to the reaction system.

In some embodiments, the process of dispersing the nanocrystals with the core-shell structure into the solution containing the organic acid and the organic phosphine to modify the nanocrystals with the core-shell structure may include: according to a molar amount-mass ratio between the organic acid and the nanocrystals with the core-shell structure of about (5~10 mmol):10 mg and a molar amount-mass ratio between the organic phosphine and the nanocrystals with the core-shell structure of about (5-10 mmol):10 mg, dispersing the nanocrystals with the core-shell structure into the solution containing the organic acid and the organic phosphine.

In some embodiments, the process of dispersing the nanocrystals with the core-shell structure into the solution containing the organic phosphine and the organic acid to modify the nanocrystals with the core-shell structure may include: dispersing the nanocrystals with the core-shell structure into the solution containing the organic phosphine and the organic acid; and then heating to about 100° C. to 320° C. for about 10 minutes to about 60 minutes.

In the process of dispersing the nanocrystals with the core-shell structure into the solution containing the organic phosphine and the organic acid to modify the nanocrystals with the core-shell structure, the selection of the organic acid and the organic phosphine may be referred to the above embodiments.

In one embodiment, the quantum dot cores may be dispersed into the solution containing the organic amine and be heated to perform surface modification on the quantum dot cores. Subsequently, a plurality of shell layer growth may be performed on the surface of the quantum dot cores. Further, the solution containing the organic amine may be added to the shell layer growth reaction system after the previous shell layer has formed, and be mixed and heated. Then the subsequent shell layer may be grown to prepare the nanocrystals with the core-shell structure. Finally, the nanocrystals with the core-shell structure may be dispersed into the solution containing the organic phosphine and the organic acid to modify the nanocrystals with the core-shell structure. The size uniformity of the nanocrystals with the core-shell structure may be improved. By using the organic amine to perform a pretreatment on the quantum dot cores and adding the organic amine to the shell layer growth reaction system after the previous shell layer has formed to mix and heat, the crystalline form of the shell layer growth may be consistent with the crystalline form of the quantum dot cores. With the gradual growth of the shell layers, because of the reaction conditions (including temperature, stirring speed, atmosphere), the final nanocrystals with the core-shell structure may have a large size dispersion rate. The post-treatment may be used to improve the size uniformity of the nanocrystals with the core-shell structure. When the nanocrystals with the core-shell structure are dispersed in the solution containing the organic acid and the organic phosphine to modify the nanocrystals with the core-shell structure, the organic acid may exchange the organic amine ligands on the surface of the nanocrystals with the core-shell structure, and promote an unstably crystallized portion of the surface of the quantum dots with the core-shell structure to decompose. The metal atoms after decomposition and organic acids may form the metal cation precursor, and the anions obtained after decomposition and the organic phosphine may form the anion precursor. The metal cation precursor and the anion precursor may preferentially undergo shell layer growth on the surface of small-particle nanocrystals with the core-shell structure having a relatively large bulk surface and a fast growth rate, to improve the size uniformity of the quantum dots with the core-shell structure.

Before growing the shell layers on the quantum dot cores, ligands on the surface of the quantum dot cores may only meet the requirements of surface passivation of the quantum dot cores and for forming a uniform monodisperse colloidal solution, while may not significantly help a solubility of the final nanocrystals with the core-shell structure. During the growth of the shell layers, the surface modifiers of the shell layers of the quantum dots with the core-shell structure may mainly be derived by the pyrolysis of the anion precursor and the cation precursor (that is, the organic compounds generated by the pyrolysis process of the shell source cation precursor, and the shell source anion precursor). With an increase of the thickness of the shell layers of the quantum dots, a relative ratio of the ligands on the surface of the quantum dots with the core-shell structure may decrease gradually, and the steric hindrance effect of the ligands on the surface of the quantum dots with the core-shell structure may be weakened, and the quantum dots may be prone to agglomeration, which further affects the monodispersity (i.e., solubility) of the colloidal quantum dots.

As illustrated in FIG. 1, the present disclosure provides another method for preparing nanocrystals with a core-shell structure. The method may include:

E01: providing quantum dot cores; and

E02: performing N-times of shell layer growth on surfaces of the quantum dot cores to forming N shell layers and achieve the nanocrystals with the core-shell structure. A shell source for the shell layer growth may include a shell source cation precursor and a shell source anion precursor.

Before and/or after performing each group of the M growth processes of adjacent shell layers, organic carboxylic acid to a shell layer growth reaction system that has formed a previous shell layer, and then may be mixed and heated. Subsequently, a latter shell layer may be grown.

N may be an integer larger than or equal to 2.

M may be a positive integer and $N/3 \leq M \leq N-1$.

In the method for preparing the nanocrystal with the core-shell structure provided by the present disclosure, the shell layer growth step may be performed N-times to prepare the core-shell quantum dot with a multi-shell-layer structure. Before and/or after performing each group of the M growth processes of adjacent shell layers, the organic carboxylic may be added to the shell layer growth reaction system where the previous layer has been formed, which is mixed and heated. Then a subsequent shell layer may be grown. The solubility of the nanocrystals with the core-shell structure may be improved. After adding the organic carboxylic to the shell layer growth reaction system where the previous layer has been formed which is mixed and heated then, the organic carboxylic may modify the surface of the shell layers of the quantum dots with the core-shell structure effectively, to avoid the weakening of the steric hindrance effect of the ligands on the surface of the quantum dots with the core-shell structure because of the low relative ratio of the ligands on the surface of the quantum dots with the core-shell structure. Correspondingly, the monodispersity of the colloidal quantum dots may be preserved and the solubility of the nanocrystals with the core-shell structure may be improved. In one embodiment, before and/or after performing each group of the M growth processes of adjacent shell layers, the organic carboxylic may be added to the shell layer growth reaction system where the previous layer has been formed, and use the carboxylic acid to modify the shell layers. M may satisfy N/3≤M≤N−1. The nanocrystals with the core-shell structure may maintain a balanced dispersion state and a relatively stable dispersion distance with each other, thereby ensuring that the obtained nanocrystals with the core-shell structure have better dispersion performance.

The present disclosure has no limit on the shell growth method in S01, and the embodiments of the present disclosure in S01 may be applied to subsequent shell growth methods including, for example, a one-step method, a two-step method or a three-step method. In one embodiment, the quantum dot cores for the one-step shell layer growth method may be derived from a production solution for preparing the quantum dot cores. In another embodiment, after the quantum dot cores are cleaned and purified following the preparation of the quantum dot cores, the quantum dot cores may be added to a solvent for the two-step or three-step shell layer growth methods. In some embodiments, the solution may be prepared according to a ratio between the mass of the quantum dot cores and a volume of the solvent of about 10 mg:(5~15 ml). In the solution with this concentration, the distance between the quantum dot cores may be appropriate, to provide a good crystallizing condiction for the shell source precursor on the surfaces of the quantum dot cores. The shell layers with good dispersion and a uniform thickness may be achieved.

In various embodiments, the quantum dot core may be a II/VI quantum dot core, a MN quantum dot core, III/VI quantum dot, a II/III/VI quantum dot, or a combination thereof. These quantum dot cores are used as examples only to illustrate the present disclosure and should not limit the scopes of the present disclosure. The quantum dot core may be anyone suitable quantum dot, and the present disclosure has no limit on this. For example, the II/VI quantum dot may be made of CdS, CdSe, CdTe, ZnS, ZnSe, ZnTe, HgS, HgSe, HgTe, CdZnSe, ZnSSe, ZnCdS, ZnCdSe, ZnSeS, ZnCdTe, ZnCdSSe, ZnCdSeS, ZnCdTeS, or other suitable materials. For example, the II/VI quantum dot core may be made of InAs, InP, GaAs, GaP, GaSb, InSb, AlAs, AlP, AlSb, InGaAs, GaAsP, InAsP, or other suitable materials. For example, the III/VI quantum dot core may be made of InS, $In_2S_3$, InSe, $In_2Se_3$, $In_4Se_3$, InTe, $In_2Te_3$, GaS, $Ga_2Se_3$, GaSe, $Ga_2Se_3$, GaTe, $Ga_2Te_3$, or other suitable materials. For example, the II/III/VI quantum dot core may be made of CuInS, CuInZnS, CuInSeS, or other suitable materials. In some embodiments, the quantum dot core may be the II/VI quantum dot core.

In one embodiment, surface ligands may bind to the surfaces of the quantum dot cores. The surface ligands may include at least one of organic carboxylic acid ligands, organic phosphonic acid ligands, organic phosphine ligands, phosphonic oxide ligands, or a combination thereof. In some embodiments, the organic carboxylic acid ligands may include, but not be limited to, at least one of oleic acid, myristic acid, and dodecanoic acid. The organic phosphonic acid ligands may be preferably selected from but not limited to at least one of octadecylphosphonic acid, myristylphosphonic acid, dodecyl. The organic phosphine ligands may be preferably selected from but not limited to at least one of trioctylphosphine and tributylphosphine. The phosphine-based ligands may be preferably selected from but not limited to at least one of trioctylphosphine oxide, tributylphosphine oxide.

In one embodiment, before preparing shell layers on the surfaces of the quantum dot cores, the quantum dot cores may be modified.

In one embodiment, the quantum dot cores may be heated up after being dispersed in a solution including the organic carboxylic acid, to perform a surface modification on the quantum dot cores. The organic carboxylic acid may bind with cations on the surfaces of the quantum dot cores to fill up cation vacancies of the quantum dot cores and reduce defect states at the interfaces between shell layers. Correspondingly, a good epitaxial interface may be provided for subsequent growth of the shell layers. Further, the organic carboxylic acid may also passivate the surface of the quantum dot cores, to avoid a self-mature of the quantum dot cores in a stage of heating up to a temperature of the shell layer growth. Quantum dots with uniform particle size may be achieved.

In one embodiment, the quantum dot cores may be dispersed in the solution including the organic carboxylic acid and then may be heated for about 20 minutes to about 60 minutes in a temperature of about 80 to about 150° C. In these conditions, the organic carboxylic acid may bind at the surfaces of the quantum dots stably, and may facilitate the passivating process of the organic carboxylic acid.

In one embodiment, the organic carboxylic acid in the solution including the organic carboxylic acid may be the organic carboxylic acid having about 8 to about 18 carbon atoms. This organic carboxylic acid may have a relatively small steric hindrance, and may facilitate the passivating process of the organic carboxylic acid. Further, the organic carboxylic acid may be a linear organic carboxylic acid containing one carboxylic group. The linear organic carboxylic acid may be beneficial to reduce steric hindrance and promote the passivating process. In some embodiments, the organic carboxylic acid may be selected from at least one of oleic acid, dodecanoic acid, myristic acid, hexadecanoic acid, and octadecanoic acid.

In one embodiment, the surface modification on the quantum dot cores may include: dispersing the quantum dot cores into the solution including the organic carboxylic acid using a mass-molar amount ratio between the quantum dot cores and the organic carboxylic acid of about 10 mg:(3~10 mmol), to perform the surface modification on the quantum dots. To enable the organic carboxylic acid to fully passivate the quantum dot cores and reduce the defect states on the surfaces of the quantum dot cores, there may be a certain excess of the organic carboxylic acid. The excess of the organic carboxylic acid may not be too much. Otherwise a viscosity may be too large and the subsequent growth rate of the shell layers may be affected and the formation of the shell layers may be impacted.

In another embodiment, the quantum dot cores may be heated up after being dispersed in the solution including the organic amine, to perform the surface modification on the quantum dot cores. The organic carboxylic acid may bind with the cations on the surfaces of the quantum dot cores to fill up the cation vacancies of the quantum dot cores and reduce the defect states at the interfaces between shell layers. A binding force between the organic amine and the cations on the surfaces of the quantum dot cores may be weak, and a small energy may be needed for the organic amine to desorb from the metal atoms in a surface of a previous shell layer. Correspondingly, during the growth of the subsequent shell layer, the anions in the shell source precursor may be more easily combined with the metal atoms in the surface of the cores to achieve epitaxial growth. A large lattice strain of the atoms at the interface between the quantum dot cores and the shell layers may be avoided, and the lattice defects at the surfaces of the epitaxial crystallized shell layers may be reduced. Further, the amino function group in the organic amine may have a dipole effect, and may drive the shell layers to grow according to the crystal orientation of the quantum dot cores during epitaxial crystallization, so that the shell layers obtained by the shell layer growth may be consistent with the crystal form of the quantum dot cores, further reducing the lattice defects between the shell layers and the surface of the quantum dot cores.

In one embodiment, the quantum dot cores may be dispersed in the solution including the organic amine and then may be heated for about 20 minutes to about 60 minutes in a temperature of about 80 to about 150° C. In these conditions, the organic amine may bind at the surfaces of the quantum dots stably, and may facilitate the passivating process of the organic amine.

In one embodiment, the organic amine in the solution including the organic amine may be the organic amine having about 8 to about 18 carbon atoms. This organic amine may have a relatively small steric hindrance, and may facilitate the passivating process of the organic amine. Further, the organic amine may be a linear organic amine containing one amino group. The linear organic amine may be beneficial to reduce steric hindrance and promote the passivating process. In some embodiments, the organic amine may be selected from at least one of oleylamine, trioctylamine, dodecylamine, tetradecylamine, hexadecylamine, octadecylamine.

In one embodiment, the surface modification on the quantum dot cores may include: dispersing the quantum dot cores into the solution including the organic amine using a mass-molar amount ratio between the quantum dot cores and the organic amine of about 10 mg:(3~10 mmol), to perform the surface modification on the quantum dots. To enable the organic amine to fully passivate the quantum dot cores and reduce the defect states on the surfaces of the quantum dot cores, there may be a certain excess of the organic amine. The excess of the organic amine may not be too much. Otherwise a viscosity may be too large and the subsequent growth rate of the shell layers may be affected and the formation of the shell layers may be impacted.

In the present disclosure, in E02, the shell layer growth reaction system may be a reaction material system and a process system for the shell layer growth on the surface of the quantum dot cores, for example, including the one-step method, the two-step method, or the three-step method (including the shell layer growth reaction material system and process system for the intermediate shell layers and the outermost shell layer). The shell layer growth process system may be referred to as performing the shell layer growth N times on the surfaces of the quantum dot cores, to prepare the N shell layers. A relationship between the N growth processes of the shell layer and the N shell layers may be: adding the shell source into the solution including the quantum dot cores to perform a first shell layer growth and prepare a first shell layer; in some embodiments, based on the first shell layer, adding the shell source to perform a second shell layer growth to prepare a second shell layer on the surface of the first shell layer; and repeating this process, to forming an N-th shell layer after N growth processes of the shell layer (that is, forming N shell layers on the surface of the quantum dot cores). The material system for the shell layer growth may refer to the material system applied during the shell layer growth. In some embodiments with the quantum dot cores in the one-step shell layer growth, when performing the first shell layer growth, the shell source cation precursor and the anion precursor may be added to the product solution including the quantum dot cores to perform the first shell layer growth. During the second shell layer growth, the shell source cation precursor and the anion precursor may be added to the solution system containing the material produced by the first shell layer growth to perform the second shell layer growth. By repeating this process, N growth processes of the shell layer may be completed sequentially. Intervals between the M growth processes of adjacent shell layers in different orders may refer to the process gaps between the completion of the growth of the previous shell layer and the growth of the latter shell layer. For example, to prepare the nanocrystals with the core-shell structure having three shell layers, M may take a value of 1 or 2. Intervals between the M growth processes of adjacent shell layers in different orders may refer to the process gap between the completion of the growth of the first shell layer and the growth of the second shell layer, the process gap between the completion of the growth of the second shell layer and the growth of the third shell layer, or the process gap between the completion of the growth of the first shell layer and the growth of the second shell layer, the process gap between the completion of the growth of the second shell layer and the growth of the third shell layer. In one embodiment, the solution including the quantum dot cores may be formed by: cleaning and purifying the prepared quantum dot cores; and then adding the quantum dot cores into the solution. In the first shell layer growth, the quantum dot cores may be diffused into the solution, and then the shell source cation precursor and anion precursor may be added into the solution containing the quantum dot cores to perform the first shell layer growth. In the second shell layer growth, the shell source cation precursor and anion precursor may be added into the solution system generated by the first shell layer growth to perform the second shell layer growth. By repeating this process, the N growth processes of the shell layer may be completed sequentially. Intervals between the M growth processes of adjacent shell layers in different orders may refer to the process gaps between the completion of the growth of the previous shell layer and the growth of the latter shell layer. For example, to prepare the nanocrystals with the core-shell structure having three shell layers, M may take a value of 1 or 2. Intervals between the M growth processes of adjacent shell layers in different orders may refer to the process gap between the completion of the growth of the first shell layer and the growth of the second shell layer, the process gap between the completion of the growth of the second shell layer and the growth of the third shell layer, or the process gap between the completion of the growth of the first shell layer and the growth of the second shell layer, the process gap between the completion of the growth of the second shell layer and the growth of the third shell layer.

In one embodiment, the shell source may include the shell source cation precursor and the shell source anion precursor.

In one embodiment, the shell-source cation precursor may include at least one of organic metal carboxylates formed by reacting the organic carboxylic acid and metal oxides or metal salts including Cd, Zn, Pb, Ag, Hg, Fe, In, and Al. In some embodiments, the shell-source cation precursor may include at least one of, but not limited to, zinc oleate, lead oleate, silver oleate, mercury oleate, indium oleate, copper oleate, iron oleate, manganese oleate, aluminum oleate, Zinc stearate, lead stearate, silver stearate, mercury stearate, indium stearate, copper stearate, iron stearate, manganese stearate, aluminum stearate, myristic acid Zinc, lead tetradecanoate, silver tetradecanoate, mercury tetradecanoate, indium tetradecanoate, copper tetradecanoate, iron tetradecanoate, manganese tetradecanoate, aluminum tetradecanoate, Zinc hexadecanoate, lead hexadecanoate, silver hexadecanoate, mercury hexadecanoate, indium hexadecanoate, copper hexadecanoate, iron hexadecanoate, manganese hexadecanoate, hexadecanoate Aluminum alkanoate, zinc dodecanoate, lead dodecanoate, silver dodecanoate, mercury dodecanoate, indium dodecanoate, copper dodecanoate, iron dodecanoate, dodecanoic acid Manganese, aluminum dodecanoate, zinc octadecanoate, lead octadecanoate, silver octadecanoate, mercury octadecanoate, indium octadecanoate, copper octadecanoate, iron octadecanoate, manganese octadecenoate, or aluminum octadecenoate. In one embodiment, the shell source anion precursor may be prepared from anion complexes formed by dispersing non-metallic elements including Te, Se, S, or P into organic molecules. When the shell-source anion precursor is an anion complex formed by organic molecules and non-metallic elements including Te, Se, S, or P, the organic molecules may include, but not be limited to, at least one of trioctylphosphine, tributylphosphine, oleic acid, and octene, the organic molecule is selected from trioctylphosphine, tributylphosphine, oleic acid, and octene.

In one embodiment, the anion precursor may be thiol, and the non-metal atom organic molecules may be organic molecules containing a single functional group thiol (—HS) functional group (including but not being limited to octadecanethiol, heptadecanethiol, hexadecanethiol, ten Pentamercaptan, tetradecanethiol, tridecanethiol, dodecanethiol, octathiol).

The present disclosure has no limit on the selection of the shell source. In some embodiments, the selection of the shell source may satisfy that a bandgap of the shell layers is larger than a bandgap of the quantum dot cores.

In one embodiment, the shell source cation precursor may include at least one of organometallic carboxylates of Cd, Zn, or Pb, and the shell-source anion precursor may be anions complex or thiol formed by dispersing Te, Se, or S as elements into organic molecules.

In one embodiment, for the growth of each shell layer, the shell source cation precursor and the shell source anion precursor may be dispersed into the solvent to get a precursor solution. Then the precursor solution may be added into the shell layer growth reaction system to perform the shell layer growth. In some embodiments, for each shell layer growth, after dispersing the shell source cation precursor and the shell source anion precursor into the solvent to get a precursor solution, the precursor solution may be added into the shell layer growth reaction system at a temperature of about 150° C. to about 320° C., to perform the shell layer growth. In each shell layer growth, the solvent may be selected from, but not limited to, TOP, TBP, OA, ODE, or OAM. When adding the shell source to perform the shell layer growth, there maybe be no limit on order for adding the shell source cation precursor and the shell source anion precursor. For example, in one embodiment, the shell source may be a mixture solution containing the dispersed the shell source cation precursor and the shell source anion precursor. Correspondingly, a process for adding the shell source may include: adding the shell source cation precursor and the shell source anion precursor into the solvent respectively to get the precursor solution containing the shell source cation precursor and the shell source anion precursor. The shell source cation precursor solution may be added before the shell source anion precursor solution. In some other embodiments, when adding the shell source cation precursor and the shell source anion precursor into the solvent respectively to get the precursor solution containing the shell source cation precursor and the shell source anion precursor, in the N-times of shell layer growth, the shell source cation precursor may be added into the shell layer growth reaction system after the shell source anion precursor to perform a current shell layer growth. The anion added firstly may bind with the metal atoms in the surface of the quantum dot cores more conveniently for epitaxial growth. A large lattice strain of the atoms at the interface between the quantum dot cores and the shell layers may be avoided, and the lattice defects at the surfaces of the epitaxial crystallized shell layers may be reduced. In the precursor solution, a concentration of the shell source cations may be about 1.5 mmol/ml to about 1.5 mmol/ml, and a concentration of the shell source anions may be about 1.5 mmol/ml to about 1.5 mmol/ml. The shell source cation precursor and the shell source anion precursor may keep appropriate concentration and dispersing density, to facilitate the binding of the cations and anions at the surfaces of the quantum dot cores. Uniform and stable shell layers may be achieved. In some embodiments, a total thickness of the shell layers (a sum of a thickness of each of the N shell layers) may be about 5 nm to about 12 nm. In some embodiments, in the N shell layers, the thickness of each shell layer may be about 0.1 nm to about 2 nm, and N may have a value of about 6 to about 18. If the thickness of each shell layer is too large or the number of times of the shell layer growth is too small, each shell layer may be too thick, the organic amine and/or the organic phosphine may not be fully bonded to the defects in the shell layers, and the lattice defects may not be reduced effectively. In some embodiments, when preparing each shell layer, a molar amount-mass ratio between the shell source cation precursor and the quantum dot cores may be about (1~1.5 mmol):10 mg, and a molar amount-mass ratio between the shell source anion precursor and the quantum dot cores may be about (1~1.5 mmol):10 mg. The shell source precursor with this ratio may be added to achieve a shell layer with a suitable thickness when performing a corresponding single cycle of shell layer growth.

In the present disclosure, before and/or after performing each group of the M growth processes of adjacent shell layers, the organic carboxylic acid may be added to the shell layer growth reaction system where the previous layer has been formed, which is mixed and heated. Then a subsequent shell layer may be grown. The organic carboxylic acid may bind on a metal atomic surface of the previous shell layer, to fill the cation vacancies on the surface of the previous shell layer. The steric hindrance effect of the ligands on the surface of the shell layers may be improved to maintain the monodispersity of the colloidal quantum dots. Therefore, the solubility of the nanocrystals with the core-shell structure may be improved.

In the present disclosure, the different order may mean that during the growth processes of one shell layer, after adding the organic amine to the shell layer growth reaction system where the previous layer has been formed which is mixed and heated then, the subsequent shell layer may be grown. The process of adding the organic amine to the shell layer growth reaction system where the previous layer has been formed which is mixed and heated then and growing the subsequent shell layer may be applied to the multiple times (M times) of the shell layer growth. In one embodiment, the shell layer growth reaction system where the previous layer has been formed, may include the base for the shell layer growth such as the quantum dot cores, or the quantum dots with the core-shell structure on whose surfaces one or more shell layers have been formed and the shell source (including the shell source cation precursor and the shell source anion precursor where the shell source cation precursor may be metal organic carboxylate). Since the surface of the outermost shell layer prepared by the last shell layer growth step may not need the shell layer growth treatment, M, that is, the times of the process of adding the organic amine to the shell layer growth reaction system where the previous layer has been formed which is mixed and heated then and growing the subsequent shell layer may be M≤N−1.

In one embodiment, if the number of organic carboxylic acid modifications is too small, the concentration of organic carboxylic acid in the shell growth reaction system may decrease as the growth of different layers of shells progresses, and the organic carboxylic acid may not bind to the surface of a previous shell layer among growth processes of adjacent shell layers. Therefore, between the M times of growth processes of adjacent shell layers, whether the organic carboxylic acid alone is used to modify the previous shell layer, or the organic carboxylic acid and the first organic phosphine are used as modifiers to modify the obtained previous shell layer, or both use organic carboxylic acid to modify the previous shell layer and use organic amine and organic phosphine as modifiers to modify the obtained previous shell layer, the total number of modification times M may be required to have an appropriate value. M may have a value satisfying N/3≤M≤N−1. In some embodiments, to achieve enough effect of organic amine modification, between each of the N−1 times of growth processes of adjacent shell layers, the organic amine may be added to the shell growth reaction system that has formed in the previous shell layer growth which is mixed and heated, then the growth of the subsequent shell layer may be performed, that is, M=N−1.

In one embodiment, during a process for adding the organic carboxylic acid to the shell growth reaction system that has formed in the previous shell layer growth which is mixed and heated and then the growth of the subsequent shell layer, the organic carboxylic acid with a ratio between the molar amount of the organic carboxylic acid and the mass of the quantum dot cores of about (0.2~0.9 mmol):10 mg may be added into the shell growth reaction system after the previous shell layer has formed which is mixed and heated subsequently.

The organic carboxylic acid may be organic carboxylic acid having about 8 to about 18 carbon atoms. The organic carboxylic acid may have a relatively small steric hindrance, which is advantageous for the modification treatment of the organic carboxylic acid. In some embodiments, the organic carboxylic acid may be a linear organic carboxylic acid containing one carboxyl group. The linear organic carboxylic acid may be beneficial to reduce steric hindrance and promote passivation. Specifically, the organic carboxylic acid may include at least one of oleic acid, dodecanoic acid, myristic acid, hexadecanoic acid, and octadecanoic acid.

In one embodiment, between the growth processes of adjacent shell layers in different orders, the first organic phosphine may be added to the shell layer growth reaction system, or both the organic amine and organic phosphine may be added to the shell layer growth reaction system, and then is mixed and heated. Then a subsequent shell layer may be grown. By adding the organic phosphine between growth processes of adjacent shell layers, the organic phosphine may produce coordination effect with non-metal atoms on the surfaces of the shell layers of quantum dot nanocrystalline, to further increase the diversity of nanocrystalline surface modifiers, reduce surface defects, and thus increase fluorescence intensity of the final sample.

In one embodiment where the first organic phosphine is added, when M<N−1, before and/or after performing each group of the M growth processes of adjacent shell layers, the organic carboxylic acid may be added to the shell layer growth reaction system where the previous layer has been formed, which is mixed and heated. Then a subsequent shell layer may be grown. Further, between S growth processes of adjacent shell layers in a different order, the first organic phosphine may be separately added to the shell layer growth reaction system where the previous layer has been formed, which is mixed and heated. Then a subsequent shell layer may be grown. Between the S growth processes of adjacent shell layers may mean between the growth processes of adjacent shell layers that no organic carboxylic acid, or no organic carboxylic acid and first organic phosphine, are added to the shell growth reaction system after the previous shell layer has formed to modify the previous shell layer relative to the current order shell layer. S may be a positive integer, and 1≤S≤(N−1)−M. In one embodiment, for two intervals between the growth processes of the adjacent shell layers, the organic carboxylic acid, and the first organic phosphine may be used as the modifier alternately, to modify the obtained previous shell layer. Then the subsequent shell layer may be grown. Between the S growth processes of adjacent shell layers in different orders, adding the first organic phosphine to the shell growth reaction system that has formed the previous shell to mix and heat, and then performing the growth of subsequent shell layer, may include adding the first organic phosphine with a ratio between the molar amount of the organic phosphine and the mass of the quantum dot cores of about (0.2~0.9 mmol): 10 mg, to the shell layer growth reaction system that has formed the previous shell layer to mix and heat.

In one embodiment where the first organic phosphine is added, each group of the M growth processes of adjacent shell layers includes one or more sub-groups of L growth processes of adjacent shell layers. And before and/or after performing each sub-group of the L growth processes of adjacent shell layers, the organic carboxylic acid, and the first organic phosphine may be added to the shell layer growth reaction system where the previous layer has been formed to mix and heat. Then a subsequent shell layer may be grown. L may be a positive integer and In some embodiments, to improve the modification effect of the organic carboxylic acid and the first organic phosphine, in each of the growth processes for adjacent shell layers, the organic carboxylic acid, and the first organic phosphine may be added to the shell layer growth reaction system where the previous layer has been formed to mix and heat. Then a subsequent shell layer may be grown. That is L=M=N-1. Between the L growth processes of adjacent shell layers in different orders, adding the organic carboxylic acid and the first organic phosphine to the shell growth reaction system that has formed the previous shell to mix and heat, and then performing the growth of subsequent shell layer, may include: adding the organic carboxylic acid and the first organic phosphine, according to a ratio between the molar amount sum of the organic carboxylic acid and the first organic phosphine and the mass of the quantum dot cores of about (0.2~0.9 mmol): 10 mg, to the shell layer growth reaction system after the previous shell layer has formed to mix and heat.

In one embodiment, the organic phosphine may be an organic phosphine which is liquid at room temperature. In some embodiments, the organic phosphine may be at least one selected from, but not limited to, trioctylphosphine and tributylphosphine. In some embodiments, the coordination effect between the organic phosphine and the non-metal atoms on the surfaces of the shell layers of the quantum dot nanocrystalline may be more significant.

The organic carboxylic acid and/or organic phosphine may form a complex with the shell source cation precursor to affect the crystallization effect of the shell layers. The non-metallic atoms pyrolyzed by the shell source anion precursor may undergo side reactions with the modifier and will affect the growth of the shell layers. Therefore, in some embodiments, the organic carboxylic acid and/or organic phosphine can neither be added at the same time as the shell-source anion precursor nor be added at the same time as the shell-source cation precursor.

In one embodiment, to ensure the shell layer source added every time can epitaxially crystallize adequately, a time of each shell layer growth may be about 5 minutes to about 20 minutes, or after the precursor solution is injected into the shell layer growth reaction system and reacted for about 5 minutes to about 20 minutes, the organic carboxylic acid and the organic phosphine may be added to modify the previous shell layer. That is, after the modification for about 5 minutes to about 20 minutes by adding the organic carboxylic acid ad the first organic phosphine to the shell layer growth reaction system after the previous shell layer has formed to mix and heat, the growth of subsequent shell layer may be performed.

In one embodiment, to ensure the shell layer source added every time can epitaxially crystallize adequately, a time of each shell layer growth may be about 5 minutes to about 20 minutes, or after the precursor solution is injected into the shell layer growth reaction system and reacts for about 5 minutes to about 20 minutes, the organic carboxylic acid and the organic phosphine may be added to modify the previous shell layer. That is, after the shell source for the growth of the shell layer preceding the current shell layer into the shell layer growth system for about 5 minutes to about 20 minutes, before and/or after performing each group of the M growth processes of adjacent shell layers, the organic carboxylic acid, and the first organic phosphine may be added to the shell growth reaction system that has formed the previous shell layer to mix and heat, and the growth of subsequent shell layer may be performed.

In another embodiment, after the shell source for growth of the shell layer preceding the current shell layer into the shell layer growth system for about 5 minutes to about 20 minutes, between the each of the L growth processes for adjacent shell layers in different orders, the organic carboxylic acid and the first organic phosphine may be added to the shell growth reaction system that has formed the previous shell layer to mix and heat, and the growth of subsequent shell layer may be performed.

In another embodiment, after the shell source for the growth of the shell layer preceding the current shell layer into the shell layer growth system for about 5 minutes to about 20 minutes, between each of the S growth processes for adjacent shell layers in different orders, the first organic phosphine may be added to the shell growth reaction system that has formed the previous shell layer to mix and heat, and the growth of subsequent shell layer may be performed.

In some embodiment, to ensure that the organic carboxylic acids and/or the first organic phosphine modify the surface of the previous shell layer adequately, after adding the organic carboxylic acids and/or the first organic phosphine into the shell layer growth reaction system for about 5 minutes to about 20 minutes, the precursor solution for growing the subsequent shell layer may be added to the shell layer growth reaction system to grow the subsequent shell layer. The present disclosure has no limit on the process to add the organic carboxylic acids and/or the first organic phosphine into the shell layer growth reaction system after the previous shell layer has formed. The organic amine and/or the organic phosphine may be added together or separately.

In one embodiment, before and/or after performing each group of the M growth processes of adjacent shell layers, after adding the organic carboxylic acid into the shell layer growth reaction system after the previous shell layer has formed to mix and heat for about 5 minutes to about 20 minutes at a temperature of about 150° C. to about 320° C., the shell source for growing the subsequent shell layer may be added to the shell layer growth reaction system to grow the subsequent shell layer.

In another embodiment, between the L growth processes for adjacent shell layers in different orders, after adding the organic carboxylic acid and the first phosphine into the shell layer growth reaction system after the previous shell layer has formed to mix and heat for about 5 minutes to about 20 minutes at a temperature of about 150° C. to about 320° C., the shell source for growing the subsequent shell layer may be added to the shell layer growth reaction system to grow the subsequent shell layer.

In another embodiment, between the S growth processes for adjacent shell layers in different orders, after adding the first organic phosphine into the shell layer growth reaction system after the previous shell layer has formed to mix and heat for about 5 minutes to about 20 minutes at a temperature of about 150° C. to about 320° C., the shell source for growing the subsequent shell layer may be added to the shell layer growth reaction system to grow the subsequent shell layer.

In one embodiment, the nanocrystals with the core-shell structure may be modified by using a post-treatment reagent.

In one method for modifying the nanocrystals with the core-shell structure, the second organic phosphine may be used to modify the nanocrystals with the core-shell structure. The nanocrystals with the core-shell structure may be dispersed into a solution containing the second organic phosphine, to modify the nanocrystals with the core-shell structure. The second organic phosphine may be combined coordinately with the non-metal atoms on the surface of the shell layers of the nanocrystals, to fill the anion vacancies of the nanocrystals with the core-shell structure and reduce the defect states on the surface of the nanocrystals with the core-shell structure. The fluorescence intensity of the nanocrystals with the core-shell structure may be improved further.

In the method using the second organic phosphine to modify the nanocrystals with the core-shell structure, an appropriate amount of the second organic phosphine may be needed in an appropriate temperature range to achieve a good effect. In some embodiments, the process of dispersing the nanocrystals with the core-shell structure into the solution containing the second organic phosphine to modify the nanocrystals with the core-shell structure may include: according to a molar amount-mass ratio between the phosphine and the nanocrystals with the core-shell structure of about (2~5 mmol):10 mg, dispersing the nanocrystals with the core-shell structure into the solution containing the second organic phosphine. When the content of the second organic phosphine is too low, the second organic phosphine may not passivate the anion vacancies enough, and the fluorescence intensity of the nanocrystals with the core-shell structure may not be improved enough. When the content of the organic phosphine is too high, film formation performance of the nanocrystals with the core-shell structure may be affected when preparing a film layer. In some embodiments, the process of dispersing the nanocrystals with the core-shell structure into the solution containing the second organic phosphine to modify the nanocrystals with the core-shell structure may include: dispersing the nanocrystals with the core-shell structure into the solution containing the second organic phosphine; and then heating to about 100° C. to 320° C. for about 10 minutes to about 60 minutes. When the temperature for the second organic phosphine to modify the nanocrystals with the core-shell structure is too low and/or the time for the second organic phosphine to modify the nanocrystals with the core-shell structure is too short, the second organic phosphine may not passivate the anion vacancies enough or even may not passivate the anion vacancies, and the fluorescence intensity of the nanocrystals with the core-shell structure may not be improved. When the temperature for the second organic phosphine to modify the nanocrystals with the core-shell structure is too high and/or the time for the second organic phosphine to modify the nanocrystals with the core-shell structure is too long, the second organic phosphine may evaporate easily to affect the modifying result and the high temperature may affect the stability of the structure of the nanocrystals with the core-shell structure.

In one embodiment, the second organic phosphine may include at least one of trioctylphosphine or tributylphosphine.

In one embodiment, the quantum dot cores may be dispersed into the solution containing the organic carboxylic acid and be heated to perform surface modification on the quantum dot cores. Subsequently, a plurality of shell layer growth may be performed on the surface of the quantum dot cores. Further, the solution containing the organic carboxylic acid may be added to the shell layer growth reaction system after the previous shell layer has formed, and be mixed and heated. Then the subsequent shell layer may be grown to prepare the nanocrystals with the core-shell structure. Finally, the nanocrystals with the core-shell structure may be dispersed into the solution containing the second organic phosphine to modify the nanocrystals with the core-shell structure. The solubility and fluorescence intensity of the nanocrystals with the core-shell structure may be improved.

In another method for modifying the nanocrystals with the core-shell structure, the organic amine may be used to modify the nanocrystals with the core-shell structure. The nanocrystals with the core-shell structure may be dispersed into a solution containing the organic amine, to modify the nanocrystals with the core-shell structure. Using the organic amine to perform the post-treatment on the nanocrystals with the core-shell structure, the organic amine may physically complex with residual cation precursor in the mixed liquid containing the nanocrystals with the core-shell structure, to reduce a freezing point of the cation precursor. This may be beneficial to the subsequent cleaning and the improvement of the purity of the mixed liquid containing the nanocrystals with the core-shell structure.

In the method using the organic amine to post-treat the nanocrystals with the core-shell structure, an appropriate amount of the organic amine may be needed in an appropriate temperature range to achieve a good effect. In some embodiments, the process of dispersing the nanocrystals with the core-shell structure into the solution containing the organic amine to post-treat the nanocrystals with the core-shell structure may include: according to a molar amount-mass ratio between the phosphine and the nanocrystals with the core-shell structure of about (5~10 mmol):10 mg, dispersing the nanocrystals with the core-shell structure into the solution containing the organic amine. When the content of the organic amine is too low, the organic amine may not optimize the nanocrystals with the core-shell structure enough. When the content of the organic amine is too high, residual organic amine after the organic amine physically complexes with residual cation precursor in the mixed liquid containing the nanocrystals with the core-shell structure may exchange with the ligands on the surfaces of the nanocrystals with the core-shell structure, and then may be removed by the exchanged organic carboxylic acid during cleaning. Since the organic amine ligands may be unstable, the organic amine ligands may fall off easily to introduce defects. The photothermal stability, the fluorescence intensity and the solubility of the nanocrystals with the core-shell structure may be reduced. In some embodiments, the process of dispersing the nanocrystals with the core-shell structure into the solution containing the organic amine to post-treat the nanocrystals with the core-shell structure may include: dispersing the nanocrystals with the core-shell structure into the solution containing the organic amine; and then heating to about 80° C. to 320° C. for about 10 minutes to about 60 minutes. When the temperature for the organic amine to post-treat the nanocrystals with the core-shell structure is too low and/or the time for the organic amine to post-treat the nanocrystals with the core-shell structure is too short, the organic amine may not enough complex with residual cation precursor in the mixed liquid containing the nanocrystals with the core-shell structure, and the purity of the nanocrystals with the core-shell structure may not be improved. When the temperature for the organic amine to post-treat the nanocrystals with the core-shell structure is too high and/or the time for the organic amine to post-treat the nanocrystals with the core-shell structure is too long, the high temperature may affect the stability of the structure of the nanocrystals with the core-shell structure.

In some embodiments, the organic amine used for modifying the nanocrystals with the core-shell structure may be organic amine having 8 to 18 carbon atoms. In some embodiments, the organic amine reagent for modifying the nanocrystals with the core-shell structure may be linear organic amine containing one amino group. The linear amines may be beneficial for reducing steric hindrance and promoting complexation. Specifically, the organic amine reagent may be at least one of oleylamine, trioctylamine, dodecylamine, tetradecylamine, hexadecylamine, and octadecylamine.

In another method for modifying the nanocrystals with the core-shell structure, the organic amine and the second organic phosphine may be used to modify the nanocrystals with the core-shell structure. The nanocrystals with the core-shell structure may be dispersed into a solution containing the organic amine and the second organic phosphine, to modify the nanocrystals with the core-shell structure. On one hand, the second organic phosphine may be combined coordinately with the non-metal atoms on the surface of the shell layers of the nanocrystals, to fill the anion vacancies of the nanocrystals with the core-shell structure and reduce the defect states on the surface of the nanocrystals with the core-shell structure. The fluorescence intensity of the nanocrystals with the core-shell structure may be improved further. In another hand, by using the organic amine to perform the post-treatment on the nanocrystals with the core-shell structure, the purity of the nanocrystals with the core-shell structure may be improved effectively and the stability of the device may be improved also. Further, when using the organic amine and the second organic phosphine to modify the nanocrystals with the core-shell structure simultaneously, the organic carboxylic acid, the organic amine, and the second organic phosphine may form ligands that are intercalated with each other and are combined with the metal and non-metal atoms on the surfaces of the nanocrystals with the core-shell structure. The ligands that are intercalated with each other may further improve the solubility of the nanocrystals with the core-shell structure and the stability of the nanocrystals with the core-shell structure.

In some embodiments, a process for dispersing the nanocrystals with the core-shell structure into the solution containing the organic amine and the second organic phosphine may be selected flexibly. For example, in one embodiment, the organic amine and the second organic phosphine with a certain ratio may be dissolved in a solution to form a mixture solution, and then the nanocrystals with the core-shell structure may be dispersed into the mixture solution. In another embodiment, the nanocrystals with the core-shell structure may be dispersed into a solution containing the organic amine and then a certain ratio of the second organic phosphine may be added into the reaction system. In another embodiment, the nanocrystals with the core-shell structure may be dispersed into a solution containing the second organic phosphine and then a certain ratio of the organic amine may be added into the reaction system.

In some embodiments, the process of dispersing the nanocrystals with the core-shell structure into the solution containing the organic amine and the second organic phosphine to heat may include: according to a molar amount-mass ratio between the organic amine and the nanocrystals with the core-shell structure of about (5~10 mmol):10 mg, and according to a molar amount-mass ratio between the second organic phosphine and the nanocrystals with the core-shell structure of about (2~5 mmol):10 mg, dispersing the nanocrystals with the core-shell structure into the solution containing the organic amine.

In some embodiments, the process of dispersing the nanocrystals with the core-shell structure into the solution containing the organic amine and the second organic phosphine to post-treat the nanocrystals with the core-shell structure may include: dispersing the nanocrystals with the core-shell structure into the solution containing the organic amine and the second organic phosphine; and then heating to about 100° C. to 320° C. for about 10 minutes to about 60 minutes.

In some embodiments, the quantum dot cores may be dispersed into a solution containing the organic amine to modify the surface of the quantum dot cores. Then a plurality of growth processes of the shell layer may be performed on the surface of the quantum dot cores. Further, the solution containing the organic carboxylic acid may be added to the shell layer growth reaction system after the previous shell layer has formed, and may be mixed and heated. Subsequently, the subsequent shell layer may be grown, to prepare the nanocrystals with the core-shell structure. The nanocrystals with the core-shell structure may be then dispersed into the solution containing the second organic phosphine and the organic amine, to modify the nanocrystals with the core-shell structure. The solubility, fluorescence intensity, and relative uniformity of the size of the nanocrystals with the core-shell structure may be improved.

In some other embodiments, the quantum dot cores may be dispersed into a solution containing the organic carboxylic acid to modify the surface of the quantum dot cores. Then a plurality of growth processes of the shell layer may be performed on the surface of the quantum dot cores. Further, the solution containing the first organic phosphine and the organic carboxylic acid may be added to the shell layer growth reaction system after the previous shell layer has formed, and may be mixed and heated. Subsequently, the subsequent shell layer may be grown, to prepare the nanocrystals with the core-shell structure. The nanocrystals with the core-shell structure may be then dispersed into the solution containing the second organic phosphine and the organic amine, to modify the nanocrystals with the core-shell structure. The solubility and fluorescence intensity of the nanocrystals with the core-shell structure may be improved.

The present disclosure also provides a type of nanocrystals with a core-shell structure prepared by the methods consistent with various embodiments of the present disclosure.

In some embodiments, the nanocrystals with the core-shell structure prepared by the methods consistent with various embodiments of the present disclosure may be used in fields including optical devices, optical films, inks with nanocrystals with the core-shell structures, glues, or biological probes.

In one embodiment, the optical devices may be, but not limited to, quantum dot light-emitting diodes or quantum dot sensitized cells.

In one embodiment, the optical films may be, but not limited to, quantum dot light-emitting barrier films or quantum dot light-emitting tubes.

In one embodiment, the inks with nanocrystals with the core-shell structures may be, but not limited to, inks formed by mixing the quantum dots and other different chemical solvents according to different ratios.

In one embodiment, the glues may be, but not limited to, glues formed by mixing the nanocrystals with the core-shell structure and other chemicals according to different viscosity ratios.

The following are some detailed embodiments of the present disclosure.

Embodiment 1

Embodiment 1 provides a two-step method for preparing nanocrystals with a core-shell structure, comprising:

1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
   14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
   21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. for 20 min for removing gas, to remove excess n-hexane solution from the solution; and then increase the temperature of the CdSe solution to 300° C.;
3: preparing CdSe/CdS quantum dots with the core-shell structure, including:
   31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
   32) growing CdS shell layers, including: dropping the CdS shell source prepared in 31) at a drop rate of 6 ml/h into the CdSe quantum dot core solution prepared in Step 2 for 10 min, stopping the injection and aging for 5 min; adding 0.5 mmol of a mixture of tetradecylamine and tributylphosphine into the quantum dot mixture solution and aging for 9 minutes; cycling 9 times of above steps according to an order of adding the CdS shell source and the adding the modifier (tetradecylamine and tributylphosphine);
   33) cooling the prepared CdSe/CdS quantum dot solution after the cycling reaction without any post-treatment to the room temperature for later use.
4: purifying CdSe/CdS quantum dots with the core-shell structure, including:
   41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of QY value may be about 75%~85%.

Embodiment 2

The embodiment 2 of the present disclosure provides another two-step method for preparing nanocrystals with a core-shell structure, including:
1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
   14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
   21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. for 20 min for removing gas, to remove excess n-hexane solution from the solution; and then increase the temperature of the CdSe solution to 300° C.;
3: preparing CdSe/CdS quantum dots with the core-shell structure, including:
   31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
   32) growing CdS shell layers, including: dropping the CdS shell source prepared in 31) at a drop rate of 6 ml/h into the CdSe quantum dot core solution prepared in Step 2 for 10 min, stopping the injection and aging for 5 min; adding 100 ml oleamine into the quantum dot mixture solution and aging for 5 minutes; cycling 9 times of above steps according to an order of adding the CdS shell source and the adding the modifier (oleamine);
   33) cooling the prepared CdSe/CdS quantum dot solution after the cycling reaction without any post-treatment to the room temperature for later use.
4: purifying CdSe/CdS quantum dots with the core-shell structure, including:

41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of QY value may be about 70%~80%.

Embodiment 3

The embodiment 3 of the present disclosure provides a one-step method for preparing nanocrystals with a core-shell structure, including:
1. Preparing CdSe quantum dot cores, including:
11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
12) preparing Se precursor, including: dissolving 0.5 mmol Se-source solution into 1 ml trioctylphosphine to form a transparent and clear solution by stirring in the room temperature;
13) preparing the CdSe quantum dot cores, including: adding 1 ml of trioctylphosphine solution into the solution achieved in 11); and adding the Se precursor formed in 12) after the solution temperature returning to 380° C. to react for 30 s.
2: preparing CdSe/CdS quantum dots with the core-shell structure, including:
21) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
22) growing CdS shell layers, including: dropping the CdS shell source prepared in 31) at a drop rate of 6 ml/h into the CdSe quantum dot core solution prepared in Step 2 for 10 min, stopping the injection and aging for 5 min; adding 500 ml oleamine into the quantum dot mixture solution and aging for 5 minutes; cycling 16 times of above steps according to an order of adding the CdS shell source and the adding the modifier (oleamine);
33) cooling the prepared CdSe/CdS quantum dot solution after the cycling reaction without any post-treatment to the room temperature for later use.
3: purifying CdSe/CdS quantum dots with the core-shell structure, including:
31) adding an appropriate amount of ethyl acetate and ethanol into the quantum dot mixture solution prepared in 3), and centrifuging the CdSe/CdS quantum dot solution;

dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of QY value may be about 76%~86%.

Embodiment 4

The embodiment 4 of the present disclosure provides a three-step method for preparing nanocrystals with a core-shell structure, including:
1. Preparing oil-soluble red CdS/CdSe/CdS quantum-well quantum dots, including:
11) preparing cadmium oleate $Cd(OA)_2$ precursor, including: putting 1 mmol of CdO, 4 ml of oleic acid (OA), and 10 ml of octadecene (ODE) together into a three-necked flask; pumping to vacuum for 30 minutes; heating to 180° C. to remove argon for 60 minutes; pumping to vacuum for 30 minutes in 180° C.; and cooling to a room temperature for later use;
12) preparing Se precursor, including: adding 10 mmol Se into 10 ml trioctylphosphine oxide; heating to and maintaining 170° C. for 30 minutes; and cooling to 140° C.;
13) preparing S (S-TOP) precursor, including: adding 20 mmol S into 10 ml trioctylphosphine oxide; heating to and maintaining 170° C. for 30 minutes; and cooling to 140° C.;
14) preparing S (-ODE) precursor, including: adding 5 mmol S into 10 ml octadecene (ODE); heating to and maintaining 110° C. for 60 minutes; and maintaining 110° C.;
15) heating the Cd(OA)2 precursor prepared by 11) to 250° C.; adding 2 ml S-ODE precursor prepared by 14) into the three-neck flask to react for 10 min, to prepare CdS quantum dot cores; and dispersing the prepared CdS quantum dot cores after centrifugal drying in n-hexane.
2: preparing CdS/CdSe quantum dots with the core-shell structure, including
21) preparing a CdSe shell source including: dispersing 1 mmol the Cd(OA)2 precursor and 1.5 mmol Se-TOP precursor into 10 ml octadecene solution and stirring for later use;
22) dispersing 10 mg CdS quantum dot cores into 1 ml OA and 10 ml ODE; after exhausting at room temperature for 20 minutes, heating to 300° C.;
23) growing CdSe shell layers, including: dropping the CdSe shell source prepared in 21) at a drop rate of 6 ml/h into the CdS quantum dot core solution prepared in Step 1 for 10 min, and aging for 5 min; adding 500 ml oleamine into the quantum dot mixture solution and aging for 5 minutes; cycling 8 times of above steps according to an order of adding the CdSe shell source and the adding the modifier (oleamine);
24) Adding a precipitant to the CdS/CdSe core-shell quantum dot mixture solution; and dispersing the prepared CdS/CdSe quantum dots with the core-shell structure after centrifugal drying in n-hexane;

3: preparing the CdS/CdSe/CdS quantum dots with the core-shell structure, including:
   31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
   32) dispersing 10 mg CdS/CdSe quantum dots in 1 ml OA and 10 ml ODE to exhaust gas for 20 min at the room temperature and heating to 300° C.;
   33) growing CdS shell layers, including: dropping the CdS shell source prepared in 31) at a drop rate of 6 ml/h into the CdSe quantum dot core solution prepared in Step 2 for 10 min, stopping the injection and aging for 5 min; adding 100 ml oleamine into the quantum dot mixture solution and aging for 5 minutes; cycling 12 times of above steps according to an order of adding the CdS shell source and the adding the modifier (oleamine);
   34) cooling the prepared CdS/CdSe/CdS quantum dot solution after the cycling reaction without any post-treatment to the room temperature for later use.

4: purifying CdS/CdSe/CdS quantum dots with the core-shell structure, including:
   41) adding an appropriate amount of ethyl acetate and ethanol into the quantum dot mixture solution prepared in 3), and centrifuging the CdSe/CdS quantum dot solution; dispersing the centrifuged CdS/CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdS/CdSe/CdS quantum dots prepared by the method, the shell layer defects formed during the shell layer growth may be reduced, the fluorescence intensity of the CdS/CdSe/CdS quantum dots with the core-shell structure may be improved. A quantum yield (QY) of the solution at room temperature may be measured by an integrating sphere (Edinburgh-FS5) of a fluorescence spectrometer. A range of QY value may be about 73%~82%.

Embodiment 5

Embodiment 5 provides a method for preparing nanocrystals with a core-shell structure, comprising:
1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
   14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including:
   21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:
   31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
   32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml olemaine into the quantum dot mixture solution and aging for 5 minutes; cycling 9 times of above steps according to an order of adding the CdS shell source and the adding the modifier (olemaine);
   33) after the completion of the shell layer growth, adding 5 mmol mixture of oleic acid and trioctylphosphine to the quantum dot mixture solution and aging for 60 minutes at 300° C.;
   34) after modifying using oleic acid and trioctylphosphine, cooling the prepared CdSe/CdS quantum dot solution to the room temperature for later use.

4: purifying CdSe/CdS quantum dots with the core-shell structure, including:
   41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the fluorescence intensity of the CdSe/CdS quantum dots with the core-shell structure may be improved. Further, the solubility and stability of the CdSe/CdS quantum dots may be improved. A quantum yield (QY) of the solution after being placed at room temperature for 30 days may be measured by an integrating sphere (Edinburgh-FS5) of a fluorescence spectrometer. A range of QY value may be about 75%~81%. An absorbance of the CdSe/CdS solution with a concentration of 0.05 mg/ml may be measured by ultraviolet-visible fluorescence spectroscopy. The range of absorbance value may be 0.9~1.5.

Embodiment 6

Embodiment 6 provides another method for preparing nanocrystals with a core-shell structure, comprising:
1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
   14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
   21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:
   31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
   32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml olemaine into the quantum dot mixture solution and aging for 5 minutes; cycling 9 times of above steps according to an order of adding the CdS shell source and the adding the modifier (olemaine);
   33) after the completion of the shell layer growth, adding 5 mmol mixture of oleic acid to the quantum dot mixture solution and aging for 60 minutes at 300° C.;
   34) cooling the prepared CdSe/CdS quantum dot solution after the treatment using the oleic acid as the modifier to the room temperature for later use.
4: purifying CdSe/CdS quantum dots with the core-shell structure, including:
   41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth, and the defect states at the surface of the CdSe/CdS quantum dots with the core-shell structure, may be reduced. The fluorescence intensity and the transient fluorescence lifetime of the CdSe/CdS quantum dots with the core-shell structure may be improved. A quantum yield (QY) of the solution after being placed at room temperature for 30 days may be measured by an integrating sphere (Edinburgh-FS5) of a fluorescence spectrometer, and a transient fluorescence spectrometry may be used to measure the transient lifetime of the CdSe/CdS quantum dots with the core-shell structure. A range of QY value may be about 75%~81%, and the transient lifetime may be 25~30 ns.

Embodiment 7

Embodiment 5 provides another method for preparing nanocrystals with a core-shell structure, comprising:
1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
   14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
   21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:
   31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
   32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 0.5 mmol mixture of tetradecylamine and tributylphosphine into the quantum dot mixture solution; cycling 9 times of above steps according to an order of adding the CdS shell source and the adding the modifier (tetradecylamine and tributylphosphine);

33) after the completion of the shell layer growth, adding 2 mmol mixture of trioctylphosphine to the quantum dot mixture solution and aging for 60 minutes at 300° C.;

34) after modifying using trioctylphosphine, cooling the prepared CdSe/CdS quantum dot solution to the room temperature for later use.

4: purifying CdSe/CdS quantum dots with the core-shell structure, including:

41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the fluorescence intensity of the CdSe/CdS quantum dots with the core-shell structure may be improved. A quantum yield (QY) of the solution after being placed at room temperature for 30 days may be measured by an integrating sphere (Edinburgh-FS5) of a fluorescence spectrometer. A range of QY value may be about 82%~91%.

Embodiment 8

Embodiment 8 provides another method for preparing nanocrystals with a core-shell structure, comprising:

1. Preparing CdSe quantum dot cores, including:

11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;

12) preparing Se precursor, including: dissolving 0.5 mmol Se-source solution into 1 ml trioctylphosphine to form a transparent and clear solution by stirring in the room temperature;

13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;

14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including:

21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increasing the temperature of the CdSe solution to 300° C.;

3: preparing CdSe/CdS quantum dots with the core-shell structure, including:

31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;

32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);

33) after the completion of the shell layer growth, cooling the prepared CdSe/CdS quantum dot solution to the room temperature for later use.

4: purifying CdSe/CdS quantum dots with the core-shell structure, including:

41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the fluorescence intensity of the CdSe/CdS quantum dots with the core-shell structure may be improved. A quantum yield (QY) of the solution after being placed at room temperature for 30 days may be measured by an integrating sphere (Edinburgh-FS5) of a fluorescence spectrometer. A range of QY value may be about 78%~92%.

Embodiment 9

Embodiment 9 provides another method for preparing nanocrystals with a core-shell structure, comprising:

1. Preparing CdSe quantum dot cores, including:

11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;

12) preparing Se precursor, including: dissolving 0.5 mmol Se-source solution into 1 ml trioctylphosphine to form a transparent and clear solution by stirring in the room temperature;

13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including:
21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:
31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 0.5 mmol mixture of oleamine and tributylphosphine into the quantum dot mixture solution; cycling 9 times of above steps according to an order of adding the CdS shell source and the adding the modifier (oleamine and tributylphosphine);
33) after the completion of the shell layer growth, cooling the prepared CdSe/CdS quantum dot solution without any treatment to the room temperature for later use.

4: purifying CdSe/CdS quantum dots with the core-shell structure, including:
41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the transient fluorescence lifetime of the CdSe/CdS quantum dots with the core-shell structure may be improved. A quantum yield (QY) of the solution after being placed at room temperature for 30 days may be measured by an integrating sphere (Edinburgh-FS5) of a fluorescence spectrometer and a transient fluorescence spectrometry may be used to measure the transient lifetime of the CdSe/CdS quantum dots with the core-shell structure. A range of QY value may be about 75%~90%, and the lifetime may be 28~32 ns.

Embodiment 10

Embodiment 10 provides another method for preparing nanocrystals with a core-shell structure, comprising:
1. Preparing CdSe quantum dot cores, including:
11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
12) preparing Se precursor, including: dissolving 0.5 mmol Se-source solution into 1 ml trioctylphosphine to form a transparent and clear solution by stirring in the room temperature;
13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including:
21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:
31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
33) after the completion of the shell layer growth, adding 3 mmol trioctylphosphine to the quantum dot mixture solution and stirring for 30 minutes at 300° C.;
34) after modifying using trioctylphosphine, cooling the prepared CdSe/CdS quantum dot solution to the room temperature for later use.

4: purifying CdSe/CdS quantum dots with the core-shell structure, including:
41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, the stability of the CdSe/CdS quantum dots with the core-shell structure may be improved. A quantum yield (QY) of the solution at room temperature may be measured by an integrating sphere (Edinburgh-FS5) of a fluorescence spectrometer. A range of QY value may be about 75%~90%. A quantum yield (QY) of the solution after being placed at room temperature for 30 days may be measured by an integrating sphere (Edinburgh-FS5) of a fluorescence spectrometer. A range of QY value may be about 76%~80%.

Embodiment 11

Embodiment 11 provides another method for preparing nanocrystals with a core-shell structure, comprising:
1. Preparing CdSe quantum dot cores, including:
    11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
    12) preparing Se precursor, including: dissolving 0.5 mmol Se-source solution into 1 ml trioctylphosphine to form a transparent and clear solution by stirring in the room temperature;
    13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
    14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
    21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:
    31) preparing a CdS shell source, including: dispersing 1 mmol of cadmium oleate precursor and 1.5 mmol of 1-octadecanethiol together in 10 ml of octadecene solution, then stirring and heating at 80° C. to make the turbid liquid clear; and then cooling to room temperature for later use;
    32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
    33) after the completion of the shell layer growth, adding 1 ml OA and 3 mmol trioctylphosphine to the quantum dot mixture solution and stirring for 30 minutes at 300° C.;
    34) after modifying using trioctylphosphine, cooling the prepared CdSe/CdS quantum dot solution to the room temperature for later use.
4: purifying CdSe/CdS quantum dots with the core-shell structure, including:
    41) adding an appropriate amount of ethyl acetate and ethanol into the quantum dot mixture solution prepared in 3), and centrifuging the CdSe/CdS quantum dot solution;
    dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, and the size uniformity of the CdSe/CdS quantum dots with the core-shell structure may be improved. A quantum yield (QY) of the solution at room temperature may be measured by an integrating sphere (Edinburgh-FS5) of a fluorescence spectrometer. The size dispersion of CdSe/CdS quantum dots with the core-shell structure measured by a scanning transmission electron microscopy may be 3~10%.

Embodiment 12

Embodiment 12 provides another method for preparing nanocrystals with a core-shell structure, comprising:
1. Preparing CdSe quantum dot cores, including:
    11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
    12) preparing Se precursor, including: dissolving 0.5 mmol Se-source solution into 1 ml trioctylphosphine to form a transparent and clear solution by stirring in the room temperature;
    13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
    14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
    21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:
- 31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
- 32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
- 33) after the completion of the shell layer growth, adding 3 mmol trioctylphosphine to the quantum dot mixture solution and stirring for 30 minutes at 300° C.;
- 34) after modifying using trioctylphosphine, cooling the prepared CdSe/CdS quantum dot solution to the room temperature for later use.

4: purifying CdSe/CdS quantum dots with the core-shell structure, including:
- 41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, and the fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 85%~95%.

Embodiment 13

Embodiment 13 provides another method for preparing nanocrystals with a core-shell structure, comprising:

1. Preparing CdSe quantum dot cores, including:
- 11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
- 12) preparing Se precursor, including: dissolving 0.5 mmol Se-source solution into 1 ml trioctylphosphine to form a transparent and clear solution by stirring in the room temperature;
- 13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
- 14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including:
- 21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:
- 31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
- 32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
- 33) after the completion of the shell layer growth, adding 1 ml OA and 3 mmol trioctylphosphine to the quantum dot mixture solution and stirring for 30 minutes at 300° C.;
- 34) after modifying using trioctylphosphine, cooling the prepared CdSe/CdS quantum dot solution to the room temperature for later use.

4: purifying CdSe/CdS quantum dots with the core-shell structure, including:
- 41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, and the solubility and film formation performance of the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 85%~95%. An absorbance of the CdSe/CdS solution (with a concentration of 0.05 mg/ml) measured by an ultraviolet-visible fluorescence spectrometry may be 0.9~1.5. A flatness of the CdSe/CdS quantum dots with the core-shell structure measured by an atomic force microscopy may be 70%~89%.

Embodiment 14

Embodiment 14 provides another method for preparing nanocrystals with a core-shell structure, comprising:

1. Preparing CdSe quantum dot cores, including:
11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
12) preparing Se precursor, including: dissolving 0.5 mmol Se-source solution into 1 ml trioctylphosphine to form a transparent and clear solution by stirring in the room temperature;
13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
21) dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/ZnS quantum dots with the core-shell structure, including:
31) preparing a ZnS shell source, including: dispersing 1 mmol of zinc oleate precursor and 1.5 mmol of 1-dodecanethiol together in 10 ml of octadecene solution, then stirring and heating at 80° C. to make the turbid liquid clear; and then cooling to room temperature for later use;
32) growing ZnS shell layers, including: dropping the ZnS shell source prepared in 31) at a drop rate of 6 ml/h into the CdSe quantum dot core solution prepared in Step 2 for 10 minutes, stopping the injection and aging for 5 minutes; adding 0.5 mmol mixture of oleamine and trioctylphosphine by once into the quantum dot mixture solution and aging for 9 minutes; cycling 9 times of above steps according to an order of adding the CdS shell source and the adding the modifier (oleamine and trioctylphosphine);
33) after the completion of the shell layer growth, cooling the prepared CdSe/ZnS quantum dot solution without any post-treatment to the room temperature for later use.
4: purifying CdSe/ZnS quantum dots with the core-shell structure, including:
41) adding an appropriate amount of ethyl acetate and ethanol into the quantum dot mixture solution prepared in 3), and centrifuging the CdSe/ZnS quantum dot solution; dispersing the centrifuged CdSe/ZnS quantum dot solution in the appropriate amount of chloroform solution to disperse it; adding acetone and methanol to the solution and performing precipitation and centrifugal separation, and repeating this step once; performing vacuum drying on the resulting CdSe/ZnS quantum dots.

In the present embodiment, for the CdSe/ZnS quantum dots prepared by the method, the solubility and monodispersity of the CdSe/ZnS quantum dots with the core-shell structure may be improved. An absorbance of the CdSe/CdS solution (with a concentration of 0.05 mg/ml) measured by an ultraviolet-visible fluorescence spectrometry may be 0.9~1.5.

Embodiment 15

Embodiment 15 provides another method for preparing nanocrystals with a core-shell structure, comprising:
1. Preparing CdSe quantum dot cores, including:
11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
12) preparing Se precursor, including: dissolving 0.5 mmol Se-source solution into 1 ml trioctylphosphine to form a transparent and clear solution by stirring in the room temperature;
13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including: dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:
31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
33) after the completion of the shell layer growth, cooling the prepared CdSe/CdS quantum dot solution without any post-treatment to the room temperature for later use.
4: purifying CdSe/CdS quantum dots with the core-shell structure, including:

41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the solubility and film formation performance of the CdSe/CdS quantum dots with the core-shell structure may be improved and correspondingly the mono-dispersity of the CdSe/CdS quantum dots with the core-shell structure may be improved. An absorbance of the CdSe/CdS solution (with a concentration of 0.05 mg/ml) measured by an ultraviolet-visible fluorescence spectrometry may be 0.95~1.65.

Embodiment 16

Embodiment 16 provides another method for preparing nanocrystals with a core-shell structure, comprising:
1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s.
2: preparing CdSe/ZnCdS quantum dots with the core-shell structure, including:
   21) preparing a ZnCdS shell source, including: dispersing 0.5 mmol of cadmium oleate precursor, 0.5 mmol zinc oleate precursor, and 1.5 mmol of 1-dodecanethiol together in 10 ml of octadecene solution, then stirring and heating at 80° C. to make the turbid liquid clear; and then cooling to room temperature for later use;
   32) growing ZnCdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 500 ml oleamine into the quantum dot mixture solution and aging for 5 minutes; cycling 16 times of above steps according to an order of adding the CdS shell source and the adding the modifier (oleamine);
   33) after the completion of the shell layer growth, cooling the prepared CdSe/CdS quantum dot solution without any post-treatment to the room temperature for later use.
4: purifying CdSe/ZnCdS quantum dots with the core-shell structure, including:
   adding an appropriate amount of ethyl acetate and ethanol into the quantum dot mixture solution prepared in 3), and centrifuging the CdSe/ZnCdS quantum dot solution; dispersing the centrifuged CdSe/ZnCdS quantum dot solution in the appropriate amount of chloroform solution to disperse it; adding acetone and methanol to the solution and performing precipitation and centrifugal separation, and repeating this step once; performing vacuum drying on the resulting CdSe/ZnCdS quantum dots.

In the present embodiment, for the CdSe/ZnCdS quantum dots prepared by the method, the solubility and film formation performance of the CdSe/ZnCdS quantum dots with the core-shell structure may be improved and correspondingly the mono-dispersity of the CdSe/CdS quantum dots with the core-shell structure may be improved. An absorbance of the CdSe/ZnCdS solution (with a concentration of 0.05 mg/ml) measured by an ultraviolet-visible fluorescence spectrometry may be 0.85~1.65.

Embodiment 17

The embodiment 17 of the present disclosure provides a three-step method for preparing nanocrystals with a core-shell structure, including:
1. Preparing oil-soluble red CdS/CdSe/CdS quantum-well quantum dots, including:
   11) preparing cadmium oleate $Cd(OA)_2$ precursor, including: putting 1 mmol of CdO, 4 ml of oleic acid (OA), and 10 ml of octadecene (ODE) together into a three-necked flask; pumping to vacuum for 30 minutes; heating to 180° C. to remove argon for 60 minutes; pumping to vacuum for 30 minutes in 180° C.; and cooling to a room temperature for later use;
   12) preparing Se precursor, including: adding 10 mmol Se into 10 ml trioctylphosphine oxide; heating to and maintaining 170° C. for 30 minutes; and cooling to 140° C.;
   13) preparing S (S-TOP) precursor, including: adding 20 mmol S into 10 ml trioctylphosphine oxide; heating to and maintaining 170° C. for 30 minutes; and cooling to 140° C.;
   14) preparing S (-ODE) precursor, including: adding 5 mmol S into 10 ml octadecene (ODE); heating to and maintaining 110° C. for 60 minutes; and maintaining 110° C.;
   15) heating the Cd(OA)2 precursor prepared by 11) to 250° C.; adding 2 ml S-ODE precursor prepared by 14) into the three-neck flask to react for 10 min, to prepare CdS quantum dot cores; and dispersing the prepared CdS quantum dot cores after centrifugal drying in n-hexane.
2: preparing CdS/CdSe quantum dots with the core-shell structure, including
   21) preparing a CdSe shell source including: dispersing 1 mmol the Cd(OA)2 precursor and 1.5 mmol Se-TOP precursor into 10 ml octadecene solution and stirring for later use;
   22) dispersing 10 mg CdS quantum dot cores into 1 ml OA and 10 ml ODE; after exhausting at room temperature for 20 minutes, heating to 300° C.;
   23) growing CdSe shell layers, including: dropping the CdSe shell source prepared in 21) at a drop rate of 6 ml/h into the CdS quantum dot core solution prepared in Step 1 for 10 min, and aging for 5 min; adding 500 ml oleamine into the quantum dot mixture solution and aging for 5 minutes; cycling 8 times of above steps according to an order of adding the CdSe shell source and the adding the modifier (oleamine);
   24) adding a precipitant to the CdS/CdSe core-shell quantum dot mixture solution; and dispersing the prepared CdS/CdSe quantum dots with the core-shell structure after centrifugal drying in n-hexane;

3: preparing the CdS/CdSe/CdS quantum dots with the core-shell structure, including:
- 31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
- 32) dispersing 10 mg CdS/CdSe quantum dots in 1 ml OA and 10 ml ODE to exhaust gas for 20 min at the room temperature and heating to 300° C.;
- 33) growing CdS shell layers, including: dropping the CdS shell source prepared in 31) at a drop rate of 6 ml/h into the CdSe quantum dot core solution prepared in Step 2 for 10 min, stopping the injection and aging for 5 min; adding 100 ml oleamine into the quantum dot mixture solution and aging for 5 minutes; cycling 12 times of above steps according to an order of adding the CdS shell source and the adding the modifier (oleamine);
- 34) cooling the prepared CdS/CdSe/CdS quantum dot solution after the cycling reaction without any post-treatment to the room temperature for later use.

4: purifying CdS/CdSe/CdS quantum dots with the core-shell structure, including:
- 41) adding an appropriate amount of ethyl acetate and ethanol into the quantum dot mixture solution prepared in 3), and centrifuging the CdSe/CdS quantum dot solution; dispersing the centrifuged CdS/CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdS/CdSe/CdS quantum dots prepared by the method, the solubility and then the mono-dispersity of the CdS/CdSe/CdS quantum dots with the core-shell structure may be improved. An absorbance of the CdS/CdSe/CdS solution (with a concentration of 0.05 mg/ml) measured by an ultraviolet-visible fluorescence spectrometry may be 0.8~1.60.

Embodiment 18

Embodiment 18 provides another method for preparing nanocrystals with a core-shell structure, comprising:

1. Preparing CdSe quantum dot cores, including:
- 11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
- 12) preparing Se precursor, including: dissolving 0.5 mmol Se-source solution into 1 ml trioctylphosphine to form a transparent and clear solution by stirring in the room temperature;
- 13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
- 14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including: dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:
- 31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
- 32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
- 34) after the completion of the shell layer growth, adding 5 mmol oleamine into the mixture solution and aging for 60 minutes at 300° C.;
- 33) cooling the prepared CdSe/CdS quantum dot solution after the treatment using the oleamine as the modifier to the room temperature for later use.

4: purifying CdSe/CdS quantum dots with the core-shell structure, including:
adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the fluorescence intensity of the CdSe/CdS quantum dots with the core-shell structure may be reduced while the stability of the device formed by the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 70%~79%. An external quantum efficiency (EQE) of a QLED device formed by the CdSe/CdS quantum dots with the core-shell structure may be reduced by 1%~5%.

Embodiment 19

Embodiment 19 provides another method for preparing nanocrystals with a core-shell structure, comprising:
1. Preparing CdSe quantum dot cores, including:

11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;

12) preparing Se precursor, including: dissolving 0.5 mmol Se-source solution into 1 ml trioctylphosphine to form a transparent and clear solution by stirring in the room temperature;

13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;

14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including: dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:

31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;

32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);

34) after the completion of the shell layer growth, adding 5 mmol trioctylphosphine into the mixture solution and aging for 60 minutes at 300° C.;

33) cooling the prepared CdSe/CdS quantum dot solution after the treatment using the oleamine as the modifier to the room temperature for later use.

4: purifying CdSe/CdS quantum dots with the core-shell structure, including:

adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 80%~89%.

Embodiment 20

Embodiment 20 provides another method for preparing nanocrystals with a core-shell structure, comprising:

1. Preparing CdSe quantum dot cores, including:

11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;

12) preparing Se precursor, including: dissolving 0.5 mmol Se-source solution into 1 ml trioctylphosphine to form a transparent and clear solution by stirring in the room temperature;

13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;

14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including: dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;

3: preparing CdSe/CdS quantum dots with the core-shell structure, including:

31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;

32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);

33) after the completion of the shell layer growth, adding 1 ml oleamine and 2 mmol trioctylphosphine into the mixture solution and aging for 60 minutes at 300° C.;

34) cooling the prepared CdSe/CdS quantum dot solution after the treatment using the oleamine and the trioctylphosphine as the modifier to the room temperature for later use.

4: purifying CdSe/CdS quantum dots with the core-shell structure, including:

adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the stability of the CdSe/CdS quantum dots with the core-shell structure may be improved. A quantum yield (QY) of the solution after being placed at room temperature for 30 days may be measured by an integrating sphere (Edinburgh-FS5) of a fluorescence spectrometer.

A range of the quantum yield (QY) may be 83%~91%.

Embodiment 21

Embodiment 21 provides another method for preparing nanocrystals with a core-shell structure, comprising:
1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
   14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including: dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/ZnS quantum dots with the core-shell structure, including:
   31) preparing a ZnS shell source, including: dispersing 1 mmol of zinc oleate precursor and 1.5 mmol of 1-dodecanethiol together in 10 ml of octadecene solution, then stirring and heating at 80° C. to make the turbid liquid clear; and then cooling to room temperature for later use;
   32) growing ZnS shell layers, including: dropping the ZnS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the ZnS shell source and the adding the modifier (oleamine);
   33) after the completion of the shell layer growth, cooling the prepared CdSe/CdS quantum dot solution without treatment to the room temperature for later use.
4: purifying CdSe/ZnS quantum dots with the core-shell structure, including:
   adding an appropriate amount of ethyl acetate and ethanol into the quantum dot mixture solution prepared in 3), and centrifuging the CdSe/ZnS quantum dot solution; dispersing the centrifuged CdSe/ZnS quantum dot solution in the appropriate amount of chloroform solution to disperse it; adding acetone and methanol to the solution and performing precipitation and centrifugal separation, and repeating this step once; performing vacuum drying on the resulting CdSe/ZnS quantum dots.

In the present embodiment, for the CdSe/ZnS quantum dots prepared by the method, the stability and the solubility of the CdSe/ZnS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 80%~92%. An absorbance of the CdSe/ZnS solution (with a concentration of 0.05 mg/ml) measured by an ultraviolet-visible fluorescence spectrometry may be 0.80~1.60.

Embodiment 22

Embodiment 22 provides another method for preparing nanocrystals with a core-shell structure, comprising:
1. Preparing CdSe quantum dot cores, including:
   11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
   12) preparing Se precursor, including: dissolving 0.5 mmol Se-source solution into 1 ml trioctylphosphine to form a transparent and clear solution by stirring in the room temperature;
   13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
   14) cleaning and purifying the CdSe quantum dot cores including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
dispersing the CdSe quantum dot cores, including: putting 2 ml of CdSe quantum dots dispersed in n-hexane prepared in Step 1 into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:

31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 0.5 mmol oleamine into the quantum dot mixture solution and aging for 5 minutes; cycling 9 times of above steps according to an order of adding the CdS shell source and the adding the modifier (oleamine);
33) after the completion of the shell layer growth, cooling the prepared CdSe/CdS quantum dot solution without post-treatment to the room temperature for later use.
4: purifying CdSe/CdS quantum dots with the core-shell structure, including:
41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the shell layer defects formed during the shell layer growth may be reduced, and the fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 76%~85%.

Embodiment 23

Embodiment 23 provides another method for preparing nanocrystals with a core-shell structure, comprising:
1. Preparing CdSe quantum dot cores, including:
11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
12) preparing Se precursor, including: dissolving 0.5 mmol Se-source solution into 1 ml trioctylphosphine to form a transparent and clear solution by stirring in the room temperature;
13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.

2: processing the CdSe quantum dot cores, including:
21) dispersing the CdSe quantum dot cores, including: putting 2 ml of CdSe quantum dots dispersed in n-hexane prepared in Step 1 and 1 ml oleamine into 10 ml of octadecene solution; firstly, heating the CdSe quantum dot solution to 150° C. and removing gas for 20 min; and then increasing the temperature of the CdSe solution to 300° C.;
3: preparing CdSe/CdS quantum dots with the core-shell structure, including:
31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
33) after the completion of the shell layer growth, adding 3 mmol trioctylphosphine to the quantum dot mixture solution and stirring for 30 minutes at 300° C.;
34) after modifying using trioctylphosphine, cooling the prepared CdSe/CdS quantum dot solution to the room temperature for later use.
4: purifying CdSe/CdS quantum dots with the core-shell structure, including:
41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the solubility and fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 80%~92%. An absorbance of the CdSe/CdS solution (with a concentration of 0.05 mg/ml) measured by an ultraviolet-visible fluorescence spectrometry may be 0.89~1.60.

Embodiment 24

Embodiment 24 provides another method for preparing nanocrystals with a core-shell structure, comprising:
1. Preparing CdSe quantum dot cores, including:
11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;

12) preparing Se precursor, including: dissolving 0.5 mmol Se-source solution into 1 ml trioctylphosphine to form a transparent and clear solution by stirring in the room temperature;
13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
21) dispersing the CdSe quantum dot cores, including: putting 2 ml of CdSe quantum dots dispersed in n-hexane prepared in Step 1 and 1 ml oleamine into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:
31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
33) after the completion of the shell layer growth, adding 1 ml OA and 3 mmol trioctylphosphine to the quantum dot mixture solution and stirring for 30 minutes at 300° C.;
34) after modifying using trioctylphosphine, cooling the prepared CdSe/CdS quantum dot solution to the room temperature for later use.
4: purifying CdSe/CdS quantum dots with the core-shell structure, including:
41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the stability and fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 80%~95%. A range of the quantum yield (QY) of the solution after being placed at the room temperature for 30 days measured by an integrating sphere (Edinburgh-FS5) of a fluorescence spectrometer may be 78%~93%.

Embodiment 25

Embodiment 25 provides another method for preparing nanocrystals with a core-shell structure, comprising:
1. Preparing CdSe quantum dot cores, including:
11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
12) preparing Se precursor, including: dissolving 0.5 mmol Se-source solution into 1 ml trioctylphosphine to form a transparent and clear solution by stirring in the room temperature;
13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
21) dispersing the CdSe quantum dot cores, including: putting 2 ml of CdSe quantum dots dispersed in n-hexane prepared in Step 1 and 1 ml oleamine into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:
31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
33) after the completion of the shell layer growth, adding 3 mmol trioctylphosphine to the quantum dot mixture solution and stirring for 30 minutes at 300° C.;
34) after modifying using trioctylphosphine, cooling the prepared CdSe/CdS quantum dot solution to the room temperature for later use.
4: purifying CdSe/CdS quantum dots with the core-shell structure, including:

41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the fluorescence intensity of the CdSe/CdS quantum dots with the core-shell structure may be improved. A quantum yield (QY) of the solution at room temperature may be measured by an integrating sphere (Edinburgh-FS5) of a fluorescence spectrometer. A range of the quantum yield (QY) may be 86%~95%.

Embodiment 26

Embodiment 24 provides another method for preparing nanocrystals with a core-shell structure, comprising:
1. Preparing CdSe quantum dot cores, including:
  11) preparing Cd precursor, including: putting 0.25 mmol CdO, 0.5 mmol of octadecylphosphonic acid, and 3 g of trioctylphosphine oxide together into a 50 ml three-necked flask, heating to 380° C. to dissolve it to form a clear and transparent solution, and maintaining this temperature;
  12) preparing Se precursor, including: dissolving 0.5 mmol Se-source solution into 1 ml trioctylphosphine to form a transparent and clear solution by stirring in the room temperature;
  13) preparing the CdSe quantum dot cores, including: adding 1 ml of trioctylphosphine solution into the solution achieved in 11); adding the Se precursor formed in 12) after the solution temperature returning to 380° C. to react for 30 s; and then adding 10 ml of octadecene to perform a quenching reaction to cool to room temperature and washing;
  14) cleaning and purifying the CdSe quantum dot cores, including: adding 30 ml of acetone to the quantum dot mixed solution to centrifuge the quantum dots, and dispersing the centrifuged CdSe quantum dots in 10 ml of n-hexane for later use.
2: processing the CdSe quantum dot cores, including:
  21) dispersing the CdSe quantum dot cores, including: putting 2 ml of CdSe quantum dots dispersed in n-hexane prepared in Step 1 and 1 ml oleamine into 10 ml of octadecene solution; firstly, heating the CdSe quantum dot solution to 150° C. and removing gas for 20 min, to remove excess n-hexane solution from the solution; and then increase the temperature of the CdSe solution to 300° C.;
3: preparing CdSe/CdS quantum dots with the core-shell structure, including:
  31) preparing a CdS shell source, including: dispersing 1 mmol of cadmium oleate precursor and 1.5 mmol of 1-dodecanethiol together in 10 ml of octadecene solution, then stirring and heating at 80° C. to make the turbid liquid clear; and then cooling to room temperature for later use;
  32) growing CdS shell layers, including: dropping the CdS shell source prepared in 31) at a drop rate of 6 ml/h into the CdSe quantum dot core solution prepared in Step 2 for 10 minutes, stopping the injection and aging for 5 minutes; adding 100 ml oleamine into the quantum dot mixture solution and aging for 5 minutes; cycling 9 times of above steps according to an order of adding the CdS shell source and the adding the modifier (oleamine);
  33) after the completion of the shell layer growth, adding 1 ml OA and 3 mmol trioctylphosphine to the quantum dot mixture solution and stirring for 30 minutes at 300° C.;
  34) after modifying using trioctylphosphine, cooling the prepared CdSe/CdS quantum dot solution to the room temperature for later use.
4: purifying CdSe/CdS quantum dots with the core-shell structure, including:
  41) adding an appropriate amount of ethyl acetate and ethanol into the quantum dot mixture solution prepared in 3), and centrifuging the CdSe/CdS quantum dot solution; dispersing the centrifuged CdSe/CdS quantum dot solution in the appropriate amount of chloroform solution to disperse it; adding acetone and methanol to the solution and performing precipitation and centrifugal separation, and repeating this step once; performing vacuum drying on the resulting CdSe/CdS quantum dots.

In the present embodiment, for the CdSe/CdS quantum dots prepared by the method, the size uniformity of the CdSe/CdS quantum dots with the core-shell structure may be improved. The size dispersion of CdSe/CdS quantum dots with the core-shell structure measured by a scanning transmission electron microscopy may be 3~10%.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. A method for preparing nanocrystals, the method comprising:
  providing quantum dot cores;
  performing N growth processes of shell layers on the quantum dot cores, thereby preparing N shell layers on a quantum dot core to form a nanocrystal with a core-shell structure, wherein:
  a shell source for performing the N growth of the shell layers includes a shell source cation precursor and a shell source anion precursor, and the shell source cation precursor is a metal organic carboxylate, and
  the N growth processes include one or more groups of M growth processes of adjacent shell layers, N is a positive integer greater than or equal to 2, and M is a positive integer and N/3≤M≤N−1; and
  between performing each group of the M growth processes of adjacent shell layers, mixing one of organic amine and organic carboxylic acid into a shell-layer-growth-reaction-system after a previous shell layer has formed, to form a mixed system, and heating the mixed system, and
  growing a subsequent shell layer over the previous shell layer;
  wherein mixing one of organic amine and organic carboxylic acid into the shell-layer-growth-reaction-system after the previous shell layer has formed, to form the mixed system and heating the mixed system, include:
  mixing one of the organic amine and the organic carboxylic acid with the shell layer growth reaction system, by a ratio between a molar amount of the organic amine and a mass of the quantum dot cores of (0.2~0.9 mmol):

10 mg or a ratio between a molar amount of the organic carboxylic acid and a mass of the quantum dot cores of (0.2~0.9 mmol):10 mg, after the previous shell layer has formed, to form the mixed system; and
heating the mixed system.

2. The method according to claim 1, wherein:
the organic amine is organic amine having 8-18 carbon atoms; and
the organic amine is linear organic amine containing one amino group.

3. The method according to claim 1, wherein:
each group of the M growth processes of adjacent shell layers includes one or more sub-groups of L growth processes of adjacent shell layers, and
the method further includes:
between performing each sub-group of the L growth processes of adjacent shell layers, after mixing the organic amine and the organic phosphine into a shell-layer-growth-reaction-system after a previous shell layer has formed, to form a mixed system, and heating the mixed system; and
growing a subsequent shell layer,
wherein L is a positive integer and L≤M, and the organic phosphine is at least one of trioctylphosphine or tributylphosphine.

4. The method according to claim 1, wherein:
when M<N−1, the N growth processes include one or more groups of S growth processes of adjacent shell layers, wherein S is a positive integer and 1≤S≤(N−1)−M; and
the method further includes:
between performing each group of the S growth processes of adjacent shell layers, after mixing organic phosphine with the shell layer growth reaction system after the previous shell layer has formed, to form a mixed system and heating the mixed system; and
growing the subsequent shell layer,
wherein:
between performing each group of the S growth processes of adjacent shell layers, means before or after several growth processes of adjacent shell layers where the organic amine, or both organic amine and organic phosphine, are not mixed with the shell layer growth reaction system after the previous shell layer has formed.

5. The method according to claim 1, wherein:
after mixing one of organic amine and organic carboxylic acid into the shell-layer-growth-reaction-system after the previous shell layer has formed, to form the mixed system and heating the mixed system, the shell source anion precursor is added into the shell layer growth reaction system and the shell source cation precursor is added into the shell layer growth reaction system, for growing the subsequent shell layer.

6. The method according to claim 1, wherein:
the shell-source cation precursor is at least one of organic metal carboxylates containing Cd, Zn, or Pb;
the shell source anion precursor is prepared from anion complexes or mercaptan formed by dispersing elements of Te, Se, or S, into organic molecules; and
the quantum dot cores include II/VI quantum dots.

7. The method according to claim 1, wherein:
a thickness of each shell layer of the N shell layers is about 0.1 nm to about 2 nm; and
N is about 6 to about 18.

8. The method according to claim 1, before performing the N growth processes of the shell layer on the quantum dot cores, further including:
dispersing the quantum dot cores into a solution containing organic carboxylic acid to perform a heating treatment.

9. The method according to claim 8, wherein:
dispersing the quantum dot cores into the solution containing the organic carboxylic acid to perform the heating treatment includes:
dispersing the quantum dot cores into the solution containing the organic carboxylic acid, by a ratio between a mass of the quantum dot cores and a molar amount of the organic carboxylic acid of 10 mg: (3-10 mmol), to form a mixed solution; or
heating the mixed solution for 20 minutes to 60 minutes at a temperature of 80° C.~150° C.

10. The method according to claim 1, before performing the N growth processes of the shell layer on the quantum dot cores, further including:
dispersing the quantum dot cores into a solution containing organic amine to perform a heating treatment.

11. The method according to claim 1, further including:
dispersing the nanocrystals with the core-shell structure into a solution containing organic phosphine to perform a heating treatment.

12. The method according to claim 11, wherein:
the organic phosphine includes at least one of trioctylphosphine or tributylphosphine.

13. The method according to claim 1, further including:
dispersing the nanocrystals with the core-shell structure into a solution containing organic acid to perform a heating treatment.

14. The method according to claim 13, wherein:
the organic acid is one or more selected from linear carboxylic acids with terminal carboxyl groups.

15. The method according to claim 1, further including:
dispersing the nanocrystals with the core-shell structure into a solution containing organic acid and organic phosphine to perform a heating treatment.

16. The method according to claim 15, wherein:
the organic phosphine includes at least one of trioctylphosphine or tributylphosphine.

17. The method according to claim 15, after performing the N growth processes of the shell layer on the quantum dot cores, further including:
dispersing the nanocrystals with the core-shell structure into a solution containing second organic phosphine to perform a heating treatment.

18. The method according to claim 1, when M<N−1, further including:
each group of the M growth processes of adjacent shell layers includes one or more sub-groups of L growth processes of adjacent shell layers, and
the method further includes:
between performing each sub-group of the L growth processes of adjacent shell layers, growing a subsequent shell layer after mixing an organic carboxylic acid and a first organic phosphine into a shell-layer-growth-reaction-system after a previous shell layer has formed, to form a mixed system, and heating the mixed system, wherein L is a positive integer and L≤M.

19. A nanocrystal, comprising:
quantum dot core; and
N shell layers on the quantum dot core to form a core-shell structure, wherein the nanocrystal is formed by:

performing N growth processes of shell layers on the quantum dot core, wherein:

a shell source for performing the N growth of the shell layers includes a shell source cation precursor and a shell source anion precursor, and the shell source cation precursor is a metal organic carboxylate, and the N growth processes include one or more groups of M growth processes of adjacent shell layers, N is a positive integer greater than or equal to 2, and M is a positive integer and $N/3 \leq M \leq N-1$; and between performing each group of the M growth processes of adjacent shell layers, mixing one of organic amine and organic carboxylic acid into a shell-layer-growth-reaction-system after a previous shell layer has formed, to form a mixed system, and heating the mixed system, and growing a subsequent shell layer over the previous shell layer;

wherein mixing one of organic amine and organic carboxylic acid into the shell-layer-growth-reaction-system after the previous shell layer has formed, to form the mixed system and heating the mixed system, include:

mixing one of the organic amine and the organic carboxylic acid with the shell layer growth reaction system, by a ratio between a molar amount of the organic amine and a mass of the quantum dot cores of (0.2~0.9 mmol): 10 mg or a ratio between a molar amount of the organic carboxylic acid and a mass of the quantum dot cores of (0.2~0.9 mmol): 10 mg, after the previous shell layer has formed, to form the mixed system; and heating the mixed system.

\* \* \* \* \*